US012246397B2

(12) United States Patent
Ogiwara et al.

(10) Patent No.: US 12,246,397 B2
(45) Date of Patent: Mar. 11, 2025

(54) LASER PROCESSING DEVICE FOR FORMING A MODIFIED REGION IN AN OBJECT AND LASER PROCESSING METHOD

(71) Applicant: HAMAMATSU PHOTONICS K.K., Hamamatsu (JP)

(72) Inventors: Takafumi Ogiwara, Hamamatsu (JP); Takeshi Sakamoto, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 390 days.

(21) Appl. No.: 17/641,519

(22) PCT Filed: Sep. 9, 2020

(86) PCT No.: PCT/JP2020/034174
§ 371 (c)(1),
(2) Date: Mar. 9, 2022

(87) PCT Pub. No.: WO2021/049546
PCT Pub. Date: Mar. 18, 2021

(65) Prior Publication Data
US 2022/0331907 A1    Oct. 20, 2022

(30) Foreign Application Priority Data
Sep. 11, 2019    (JP) ................. 2019-165708

(51) Int. Cl.
*B23K 26/53*    (2014.01)
*B23K 26/067*    (2006.01)
(Continued)

(52) U.S. Cl.
CPC .......... *B23K 26/53* (2015.10); *B23K 26/0676* (2013.01); *H01L 21/268* (2013.01);
(Continued)

(58) Field of Classification Search
CPC ..................................................... B23K 26/53
See application file for complete search history.

(56) References Cited

U.S. PATENT DOCUMENTS 5,055,653 A * 10/1991 Funami ............. B23K 26/0643
219/121.75
2006/0076327 A1* 4/2006 Kobayashi ............. B23K 26/40
219/121.73
(Continued)

FOREIGN PATENT DOCUMENTS

CN          1757479 A    4/2006
CN        102574245 A    7/2012
(Continued)

OTHER PUBLICATIONS

International Preliminary Report on Patentability mailed Mar. 24, 2022 for PCT/JP2020/034174.

*Primary Examiner* — Peter Bradford
(74) *Attorney, Agent, or Firm* — Faegre Drinker Biddle Reath LLP

(57) ABSTRACT

A laser processing apparatus includes a support part, a light source, a spatial light modulator, a converging part, and a controller. The controller controls the spatial light modulator so that laser light is branched into a plurality of rays of processing light including 0th-order light and a plurality of converging points for the plurality of rays of processing light are located at positions different from each other in a Z direction and an X direction, and controls at least one of the support part and the converging part. The controller controls the spatial light modulator so that a converging point of the 0th-order light in the Z direction is located on an opposite side of a converging point of non-modulated light of the laser light with respect to an ideal converging point of the 0th-order light.

7 Claims, 27 Drawing Sheets

(51) Int. Cl.
*H01L 21/268* (2006.01)
*H01L 21/67* (2006.01)
*B23K 103/00* (2006.01)
*G02F 1/133* (2006.01)

(52) U.S. Cl.
CPC .... *H01L 21/67115* (2013.01); *B23K 2103/56* (2018.08); *G02F 1/13306* (2013.01)

(56) References Cited

U.S. PATENT DOCUMENTS

| | | | | |
|---|---|---|---|---|
| 2006/0151443 | A1* | 7/2006 | Fukuyo | B23K 26/40 219/121.6 |
| 2011/0037149 | A1* | 2/2011 | Fukuyo | B23K 26/066 219/121.72 |
| 2012/0026489 | A1* | 2/2012 | Zhao | G01N 21/8806 356/237.2 |
| 2012/0223061 | A1* | 9/2012 | Atsumi | B23K 26/53 219/121.72 |
| 2017/0106476 | A1* | 4/2017 | Sakamoto | B23K 26/064 |
| 2017/0113301 | A1* | 4/2017 | Sakamoto | B23K 26/0676 |
| 2017/0216973 | A1* | 8/2017 | Sakamoto | C03B 33/0222 |
| 2019/0067049 | A1* | 2/2019 | Cheng | H01L 21/67092 |
| 2021/0098973 | A1* | 4/2021 | Gong | G02B 26/06 |

FOREIGN PATENT DOCUMENTS

| | | | |
|---|---|---|---|
| CN | 102886609 | A * | 1/2013 |
| CN | 106163724 | A | 11/2016 |
| CN | 106413974 | A | 2/2017 |
| CN | 106463374 | A | 2/2017 |
| CN | 109490201 | A | 3/2019 |
| JP | 2006-108478 | A | 4/2006 |
| JP | 2010-260062 | A | 11/2010 |
| JP | 5775265 | B2 | 9/2015 |
| JP | 2015-223620 | A | 12/2015 |
| JP | 2015-226012 | A | 12/2015 |
| JP | 2016-111315 | A | 6/2016 |

* cited by examiner

Fig. 11

| SHIFT AMOUNT | -10.6 μm | -5.3 μm | -2.7 μm | -1.3 μm | +1.3 μm | +2.7 μm | +5.3 μm | +10.6 μm |
|---|---|---|---|---|---|---|---|---|
| CROSS-SECTIONAL PICTURE | | | | | | | | |
| RESULT | A | A | A | C | B | B | B | C |

Fig. 13

| SHIFT AMOUNT | 2.0 μm | 2.7 μm | 3.4 μm | 4.2 μm | 5.6 μm |
|---|---|---|---|---|---|
| CROSS-SECTIONAL PICTURE | | | | | |
| RESULT | C | B | B | A | A |

Fig. 15

| SHIFT AMOUNT | -80 μm | -60 μm | -40 μm | -20 μm | +20 μm | +40 μm | +60 μm | +80 μm |
|---|---|---|---|---|---|---|---|---|
| DISTANCE | 0 μm | 20 μm | 40 μm | 60 μm | 100 μm | 120 μm | 140 μm | 160 μm |
| CROSS-SEC-TIONAL PICTURE | | | | | | | | |
| RESULT | C | C | C | C | A | A | A | A |

Fig.16

| | | Z-DIRECTION SHIFT | | |
|---|---|---|---|---|
| | | NO Z-DIRECTION SHIFT | +20 μm | +40 μm |
| NO SHIFT IN X DIRECTION AND Y DIRECTION | | B | A | A |
| Y-DIRECTION SHIFT | 2.0 μm | C | A | A |
| | 2.7 μm | B | A | A |
| | 3.4 μm | B | A | A |
| | 4.2 μm | A | A | A |
| | 5.6 μm | A | A | A |
| X-DIRECTION SHIFT | +1.3 μm | C | A | A |
| | +2.7 μm | B | A | A |
| | +5.3 μm | B | A | A |
| | -1.3 μm | C | A | A |
| | -2.7 μm | A | A | A |
| | -5.3 μm | A | A | A |

| NUMBER OF BRANCHES | 3 |
|---|---|
| SHIFT DIRECTION | X DIRECTION |

| | ZH (μm) | OUTPUT (W) | SPHERICAL ABERRATION | BP |
|---|---|---|---|---|
| SD1 | Z1 | 1.2 | | |
| SD2 | Z2 | 1.2 | REFERENCE | 1 |
| SD3 | Z3 | 1.0 | | |

(b)

102

| REFERENCE SD | SD2 |
|---|---|
| X-DIRECTION BRANCH AMOUNT | X10 (μm) |
| X-DIRECTION SHIFT AMOUNT | X1 (μm) |

| | | 103 | | |
|---|---|---|---|---|
| NUMBER OF BRANCHES | 3 | | | |
| SHIFT DIRECTION | Y DIRECTION | | | |

| | ZH (μm) | OUTPUT (W) | SPHERICAL ABERRATION | BP |
|---|---|---|---|---|
| SD1 | Z1 | 1.2 | | |
| SD2 | Z2 | 1.2 | REFERENCE | 1 |
| SD3 | Z3 | 1.0 | | |

(b)

102

| REFERENCE SD | SD2 |
|---|---|
| X-DIRECTION BRANCH AMOUNT | X10 (μm) |
| Y-DIRECTION SHIFT AMOUNT | Y1 (μm) |

| | | 103 |
|---|---|---|
| NUMBER OF BRANCHES | 3 | |
| SHIFT DIRECTION | Z DIRECTION | |

| | ZH (μm) | OUTPUT (W) | SPHERICAL ABERRATION | BP |
|---|---|---|---|---|
| SD1 | Z1 | 1.2 | | |
| SD2 | Z2 | 1.2 | REFERENCE | 1 |
| SD3 | Z3 | 1.0 | | |

(b)

102

| REFERENCE SD | SD2 |
|---|---|
| X-DIRECTION BRANCH AMOUNT | X10 (μm) |
| Z-DIRECTION SHIFT AMOUNT | Z4 (μm) |

LASER PROCESSING DEVICE FOR FORMING A MODIFIED REGION IN AN OBJECT AND LASER PROCESSING METHOD

TECHNICAL FIELD

The present disclosure relates to a laser processing apparatus and a laser processing method.

BACKGROUND ART

As a laser processing apparatus for forming a modified region in an object by irradiating the object with laser light, an apparatus that modulates the laser light so that the laser light is branched into a plurality of rays of processing light and the plurality of rays of processing light are converged at different positions is known (see Patent Literatures 1 and 2, for example).

CITATION LIST

Patent Literature

Patent Literature 1: Japanese Unexamined Patent Publication No. 2015-223620
Patent Literature 2: Japanese Unexamined Patent Publication No. 2015-226012

SUMMARY OF INVENTION

Technical Problem

In the laser processing apparatus as described above, a plurality of rows of modified regions can be formed by a plurality of rays of processing light. Thus, it is very effective in reducing the processing time.

An object of the present disclosure is to provide a laser processing apparatus and a laser processing method capable of obtaining high processing quality in processing of branching laser light into a plurality of rays of processing light.

Solution to Problem

According to an aspect of the present disclosure, there is provided a laser processing apparatus for forming a modified region in an object by irradiating the object with laser light. The laser processing apparatus includes a support part configured to support the object having a first surface and a second surface on an opposite side of the first surface so that the second surface is perpendicular to a Z direction, a light source configured to emit the laser light, a spatial light modulator configured to modulate the laser light emitted from the light source, a converging part configured to converge the laser light modulated by the spatial light modulator from the second surface side to the object, and a controller configured to control the spatial light modulator so that the laser light is branched into a plurality of rays of processing light including 0th-order light and a plurality of converging points for the plurality of rays of the processing light are located at positions different from each other in the Z direction and an X direction perpendicular to the Z direction, and control at least one of the support part and the converging part so that the X direction coincides with an extension direction of a line extending along the second surface and the plurality of converging points move relatively along the line. The controller controls the spatial light modulator so that a converging point of the 0th-order light in the Z direction is located on an opposite side of a converging point of non-modulated light of the laser light with respect to an ideal converging point of the 0th-order light or on an opposite side of the ideal converging point of the 0th-order light with respect to the converging point of the non-modulated light.

In the laser processing apparatus, the condensing point of the 0th-order light which is one of the plurality of rays of processing light is located on an opposite side of the converging point of the non-modulated light with respect to the ideal converging point of the 0th-order light or on an opposite side of the ideal converging point of the 0th-order light with respect to the converging point of the non-modulated light, in the Z direction. Thus, an occurrence of a situation in which the non-modulated light that is not modulated by the spatial light modulator among rays of the laser light has an influence on a converging state of the 0th-order light (for example, the non-modulated light interferes with the 0th-order light) is prevented. Thus, according to the laser processing apparatus, it is possible to obtain high processing quality in processing of branching laser light into a plurality of rays of processing light.

According to the aspect of the present disclosure, in the laser processing apparatus, the controller may include an input reception part configured to receive an input of first data regarding a formation position of a modified region by a plurality of rays of processing light. The controller may control at least one of the support part and the converging part based on the first data and second data regarding a distance between an ideal converging point of the 0th-order light and the converging point of the 0th-order light, so that the converging point of the 0th-order light is located at a predetermined depth from the second surface. Thus, it is possible to form a modified region at a desired depth from the second surface while suppressing an influence of non-modulated light on a converging state of the 0th-order light.

According to the aspect of the present disclosure, in the laser processing apparatus, the controller may further include a storage part configured to store second data. Thus, it is possible to save the trouble taken for the operator to input second data.

According to the aspect of the present disclosure, in the laser processing apparatus, the input reception part may receive an input of the second data. Thus, the operator can set a distance between the ideal converging point of the 0th-order light and the converging point of the 0th-order light to a desired value.

According to the aspect of the present disclosure, in the laser processing apparatus, the controller may control the spatial light modulator so that the plurality of converging points have a positional relation of being located closer to the first surface in the Z direction toward a front side in a relative movement direction of the laser light. Thus, it is possible to suppress inhibition of converging of each of the plurality of rays of processing light by the formed modified region.

According to the aspect of the present disclosure, in the laser processing apparatus, the controller may control the spatial light modulator so that processing light branched on a foremost side in a relative movement direction of the laser light among the plurality of rays of processing light has a largest output. Thus, in a case where a fracture extending through a plurality of rows of modified regions is formed in the object, it is possible to largely extend the fracture to the first surface side.

According to another aspect of the present disclosure, there is provided a laser processing method for forming a modified region in an object by irradiating the object with laser light. The laser processing method includes a first step of preparing the object having a first surface and a second surface on an opposite side of the first surface, and a second step of modulating the laser light by using a spatial light modulator, in a state where the object is supported so that the second surface is perpendicular to a Z direction, and converging the modulated laser light to the object from the second surface side. In the second step, the spatial light modulator is controlled so that the laser light is branched into a plurality of rays of processing light including 0th-order light and a plurality of converging points for the plurality of rays of the processing light are located at positions different from each other in the Z direction and an X direction perpendicular to the Z direction, the spatial light modulator is controlled so that a converging point of the 0th-order light in the Z direction is located on an opposite side of a converging point of non-modulated light of the laser light with respect to an ideal converging point of the 0th-order light or on an opposite side of the ideal converging point of the 0th-order light with respect to the converging point of the non-modulated light, and the plurality of converging points are moved relatively along a line in a state where the X direction coincides with an extension direction of the line extending along the second surface.

According to the laser processing method, for the similar reason to that of the laser processing apparatus, it is possible to obtain high processing quality in processing of branching laser light into a plurality of rays of processing light.

Advantageous Effects of Invention

According to the present disclosure, it is possible to provide a laser processing apparatus and a laser processing method capable of obtaining high processing quality in processing of branching laser light into a plurality of rays of processing light.

BRIEF DESCRIPTION OF DRAWINGS

FIG. 11 is a view illustrating an experimental result on the laser processing method of the X-direction shift.

FIG. 13 is a view illustrating an experimental result on the laser processing method of the Y-direction shift.

FIG. 15 is a view illustrating an experimental result on the laser processing method of the Z-direction shift.

FIG. 16 is a diagram illustrating experimental results on a laser processing method of a combination of the Z-direction shift and the Y-direction shift and a laser processing method of a combination of the Z-direction shift and the X-direction shift.

FIG. 18 is a diagram illustrating a display example of an input reception part and a table example of a storage part in the laser processing method of the X-direction shift.

FIG. 21 is a diagram illustrating a display example of the input reception part and a table example of the storage part in the laser processing method of the Y-direction shift.

FIG. 26 is a diagram illustrating a display example of the input reception part and a table example of the storage part in the laser processing method of the Z-direction shift.

DESCRIPTION OF EMBODIMENTS

Hereinafter, embodiments of the present disclosure will be described in detail with reference to the drawings. The same or corresponding parts in the respective drawings are denoted with the same reference signs, and repetitive descriptions will be omitted.

[Configuration of Laser Processing Apparatus]

Figure 1:
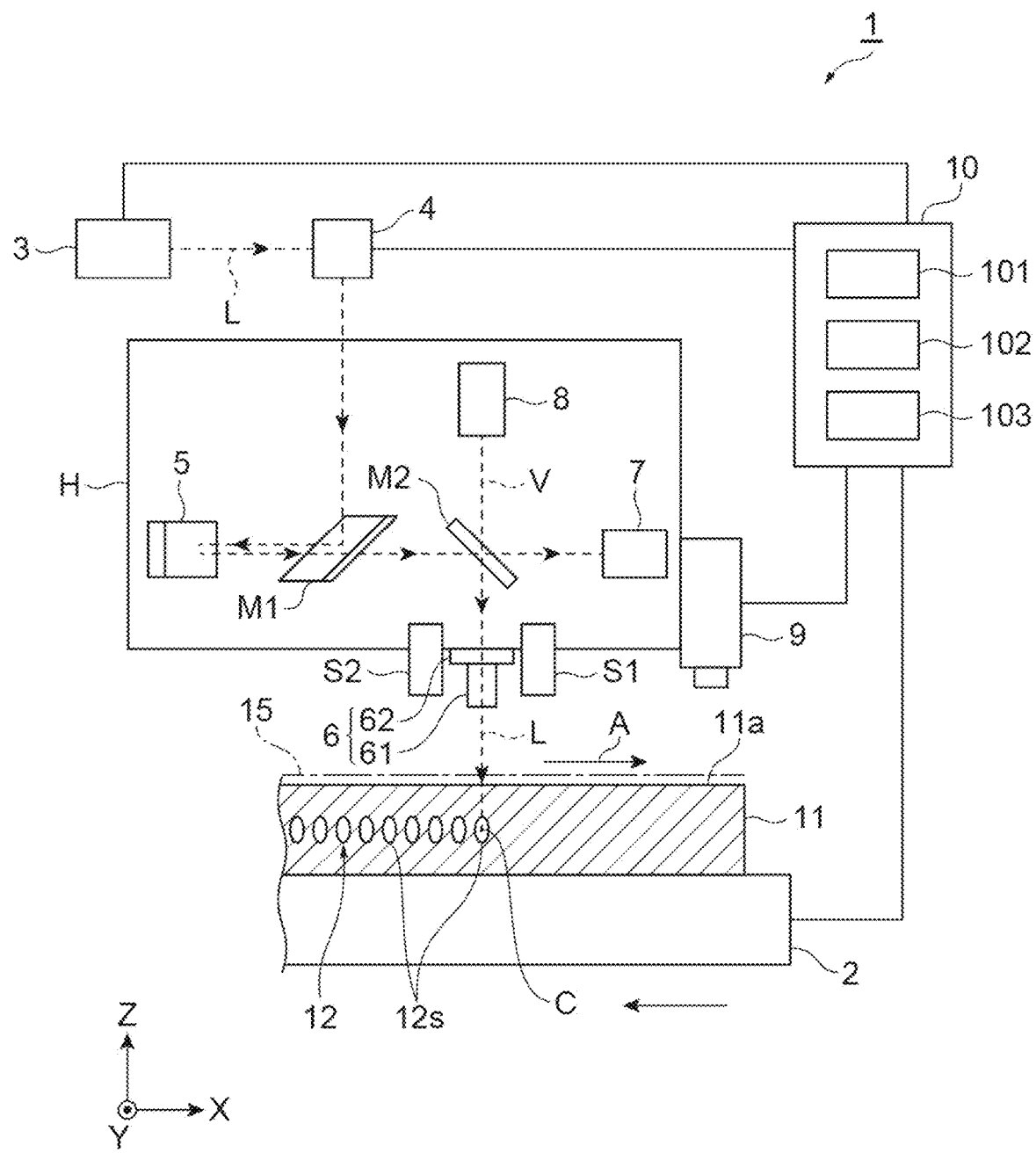
FIG. 1 is a configuration diagram illustrating a laser processing apparatus according to an embodiment.

As illustrated in FIG. 1, a laser processing apparatus 1 includes a support part 2, a light source 3, an optical axis adjusting part 4, a spatial light modulator 5, a converging part 6, an optical axis monitoring part 7, a visible image capturing part (image capturing part) 8, an infrared image capturing part 9, and a controller 10. The laser processing apparatus 1 is an apparatus for forming a modified region 12 in an object 11 by irradiating the object 11 with laser light L. In the following description, three directions perpendicular to each other are referred to as an X direction, a Y direction, and a Z direction, respectively. In the present embodiment, the X direction is a first horizontal direction, the Y direction is a second horizontal direction perpendicular to the first horizontal direction, and the Z direction is a vertical direction.

The support part 2 supports the object 11 by attracting a film (not illustrated) attached to the object 11, so that the surface 11a of the object 11 is perpendicular to the Z direction, for example. The support part 2 can move along the X-direction and the Y-direction, respectively, and can rotate around an axis parallel to the Z-direction as a center line.

The light source 3 emits the laser light L by, for example, a pulse oscillation method. The laser light L has transmittance with respect to the object 11.

The optical axis adjusting part 4 adjusts the optical axis of the laser light L emitted from the light source 3. In the present embodiment, the optical axis adjusting part 4 adjusts the optical axis of the laser light L emitted from the light source 3 while changing the traveling direction of the laser light L along the Z direction. The optical axis adjusting part 4 is configured by, for example, a plurality of reflection mirrors of which positions and angles can be adjusted.

The spatial light modulator 5 is disposed in a housing H. The spatial light modulator 5 modulates the laser light L output from the light source 3. In the present embodiment, the laser light L traveling downward along the Z direction from the optical axis adjusting part 4 enters into the housing H. The laser light L entering into the housing H is horizontally reflected by a mirror M1 so as to form an angle with respect to the Y direction. The laser light L reflected by the mirror M1 enters into the spatial light modulator 5. The spatial light modulator 5 modulates the laser light L entering in this manner while horizontally reflecting the laser light L along the Y direction.

The converging part 6 is attached to the bottom wall of the housing H. The converging part 6 converges the laser light L modulated by the spatial light modulator 5 to the object 11 supported by the support part 2, from the surface 11a side along the Z direction. In the present embodiment, the laser light L which has been horizontally reflected along the Y direction by the spatial light modulator 5 is reflected downward along the Z direction by a dichroic mirror M2. Then, the laser light L reflected by the dichroic mirror M2 enters into the converging part 6. The converging part 6 converges the laser light L entering in this manner to the object 11. In the present embodiment, the converging part 6 is configured by attaching a converging lens unit 61 to the bottom wall of the housing H via a drive mechanism 62. The drive mechanism 62 moves the converging lens unit 61 along the Z direction by, for example, a driving force of a piezoelectric element.

In the housing H, an imaging optical system (not illustrated) is disposed between the spatial light modulator 5 and the converging part 6. The imaging optical system constitutes a double-sided telecentric optical system in which the reflecting surface of the spatial light modulator 5 and the entrance pupil surface of the converging part 6 are in an imaging relation. Thus, an image of the laser light L on the reflecting surface of the spatial light modulator 5 (an image of the laser light L modulated by the spatial light modulator 5) is transferred (formed) to (on) the entrance pupil surface of the converging part 6.

A pair of distance measuring sensors S1 and S2 are attached to the bottom wall of the housing H to be located on both sides of the converging lens unit 61 in the X direction. Each of the distance measuring sensors S1 and S2 acquires displacement data of the surface 11a by emitting distance measurement light (for example, laser light) to the surface 11a of the object 11 and detecting the distance measurement light reflected by the surface 11a.

The optical axis monitoring part 7 is disposed in the housing H. The optical axis monitoring part 7 detects a part (for example, 0.5% to 5% of the laser light L entering into the dichroic mirror M2) of the laser light L transmitted through the dichroic mirror M2. The detection result by the optical axis monitoring part 7 indicates, for example, a relation between the optical axis of the laser light L entering into the converging lens unit 61 and the optical axis of the converging lens unit 61.

The visible image capturing part 8 is disposed in the housing H. The visible image capturing part 8 emits visible light V and acquires an image of the object 11 by the visible light V as an image. In the present embodiment, the visible light V emitted from the visible image capturing part 8 is applied onto the surface 11a of the object 11 via the dichroic mirror M2 and the converging part 6. Then, the visible light V reflected by the surface 11a is detected by the visible image capturing part 8 via the converging part 6 and the dichroic mirror M2.

The infrared image capturing part 9 is attached to the side wall of housing H. The infrared image capturing part 9 emits infrared light and acquires an image of the object 11 by the infrared light as an image. In the present embodiment, the housing H and the infrared image capturing part 9 are integrally movable along the Z direction.

The controller 10 controls the operation of each part in the laser processing apparatus 1. The controller 10 includes a processor 101, a storage part 102, and an input reception part 103. The processor 101 is configured as a computer device including a processor, a memory, a storage, a communication device, and the like. In the processor 101, the processor executes software (program) read into the memory or the like, and controls reading and writing of data in the memory and the storage, and communication by a communication device. The storage part 102 is, for example, a hard disk or the like, and stores various types of data. The input reception part 103 is an interface that receives inputs of various types of data from an operator. In the present embodiment, the input reception part 103 constitutes a graphical user interface (GUI).

In the laser processing apparatus 1 configured as described above, if the laser light L is converged in the object 11, the laser light L is absorbed at a portion corresponding to a converging point C of the laser light L, and thus the modified region 12 is formed in the object 11. The modified region 12 is a region in which the density, the refractive index, the mechanical strength, and other physical properties are different from those of the surrounding non-modified region. Examples of the modified region 12 include a melting treatment region, a crack region, a dielectric breakdown region, and a refractive index change region. The modified region 12 has a characteristic that fractures easily extend from the modified region 12 to the incident side of the laser light L and the opposite side of the incident side. Such characteristics of the modified region 12 are used for cutting the object 11.

An operation of the laser processing apparatus 1 in a case where the modified region 12 is formed in the object 11 along a line 15 for cutting the object 11 will be described as an example.

First, the laser processing apparatus 1 rotates the support part 2 about an axis parallel to the Z direction as a center line so that the line 15 set in the object 11 becomes parallel to the X direction. Then, the laser processing apparatus 1 moves the support part 2 along each of the X direction and the Y direction based on an image (for example, an image of a functional element layer included in the object 11) acquired by the infrared image capturing part 9, so that the converging point C of the laser light L is located on the line 15 when viewed from the Z direction. Such "alignment of the converging part 6 with respect to a processing start position on the line 15" is referred to as "alignment" below.

Then, the laser processing apparatus 1 moves the housing H (that is, the converging part 6) along the Z direction based on an image (for example, an image of the surface 11a of the object 11) acquired by the visible image capturing part 8, so that the converging point C of the laser light L is located on the surface 11a. Such "alignment of the converging part 6 with respect to the surface 11a" is referred to as "height setting" below. The laser processing apparatus 1 moves the housing H (that is, the converging part 6) along the Z direction with the position as a reference, so that the converging point C of the laser light L is located at a predetermined depth from the surface 11a.

The laser processing apparatus 1 causes the light source 3 to emit the laser light L and moves the support part 2 along the X direction so that the converging point C of the laser light L moves relatively along the line 15. A "relative movement direction of the laser light L with respect to the object 11" is referred to as a "relative movement direction A of the laser light L" below. At this time, the laser processing apparatus 1 operates the drive mechanism 62 of the converging part 6 based on the displacement data of the surface 11a acquired by the distance measuring sensor located on the front side in the relative movement direction A of the laser light L among the pair of distance measuring sensors S1 and S2, so that the converging point C of the laser light L is located at a predetermined depth from the surface 11a.

As described above, one row of modified regions 12 is formed along the line 15 and at a uniform depth from the surface 11a of the object 11. When the laser light L is emitted from the light source 3 by a pulse oscillation method, a plurality of modified spots 12s are formed to be arranged in a row along the X direction. One modified spot 12s is formed by irradiation with the laser light L of one pulse. The modified region 12 in one row is a set of a plurality of modified spots 12s arranged in one row. Adjacent modified spots 12s may be connected to each other or separated from each other, depending on a pulse pitch of the laser light L (a value obtained by dividing the relative movement speed of the converging point C with respect to the object 11 by a repetition frequency of the laser light L).

[Configuration of Spatial Light Modulator]

Figure 2:
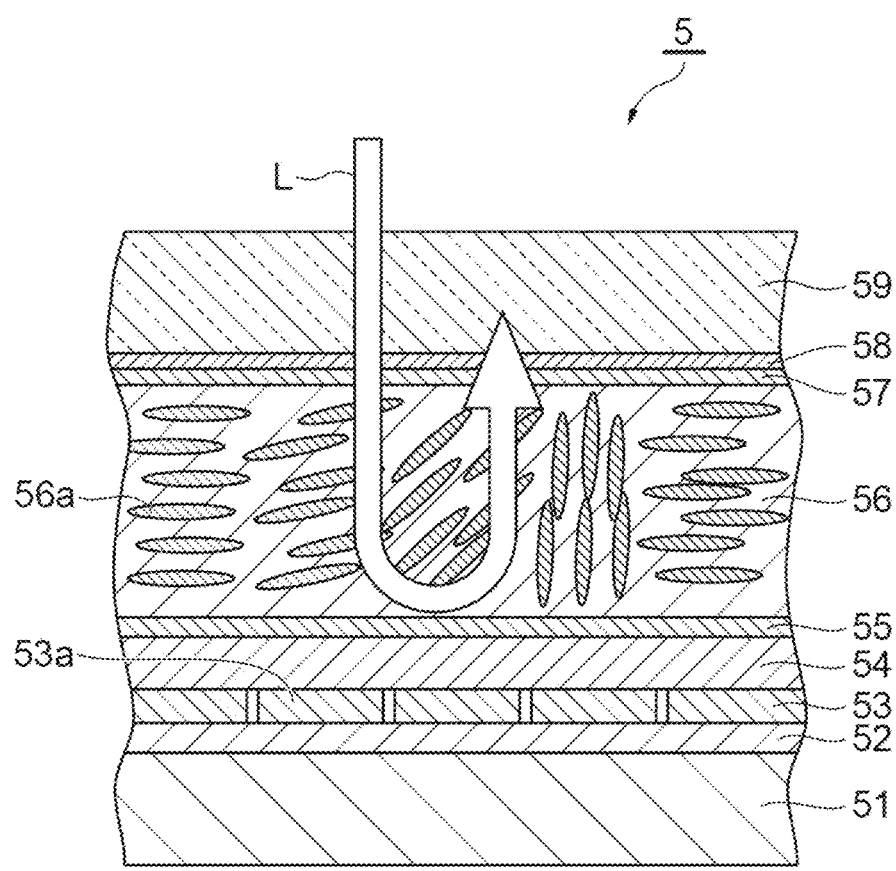
FIG. 2 is a cross-sectional view illustrating a portion of a spatial light modulator illustrated in FIG. 1.

In the present embodiment, the spatial light modulator 5 is a spatial light modulator (SLM) of a reflective liquid crystal (LCOS: Liquid Crystal on Silicon). As illustrated in FIG. 2, the spatial light modulator 5 is configured in a manner that a drive circuit layer 52, a pixel electrode layer 53, a reflective film 54, an alignment film 55, a liquid crystal layer 56, an alignment film 57, a transparent conductive film 58, and a transparent substrate 59 are stacked on a semiconductor substrate 51 in this order.

The semiconductor substrate 51 is, for example, a silicon substrate. The drive circuit layer 52 constitutes an active matrix circuit on the semiconductor substrate 51. The pixel electrode layer 53 includes a plurality of pixel electrodes 53a arranged in a matrix along the surface of the semiconductor substrate 51. Each of the pixel electrodes 53a is formed of, for example, a metal material such as aluminum. A voltage is applied to each of the pixel electrodes 53a by the drive circuit layer 52.

The reflective film 54 is, for example, a dielectric multilayer film. The alignment film 55 is provided on the surface of the liquid crystal layer 56 on the reflective film 54 side. The alignment film 57 is provided on the surface of the liquid crystal layer 56 on the opposite side of the reflective film 54. Each of the alignment films 55 and 57 is formed of, for example, a polymer material such as polyimide. For example, a rubbing treatment is performed on a contact surface of each of the alignment films 55 and 57 with the liquid crystal layer 56. The alignment films 55 and 57 align liquid crystal molecules 56a contained in the liquid crystal layer 56 in a predetermined direction.

The transparent conductive film 58 is provided on the surface of the transparent substrate 59 on the alignment film 57 side, and faces the pixel electrode layer 53 with the liquid crystal layer 56 and the like interposed therebetween. The transparent substrate 59 is, for example, a glass substrate. The transparent conductive film 58 is formed of, for example, a light transmissive and conductive material such as ITO. The transparent substrate 59 and the transparent conductive film 58 cause the laser light L to be transmitted.

In the spatial light modulator 5 configured as described above, when a signal indicating a modulation pattern is input from the controller 10 to the drive circuit layer 52, a voltage corresponding to the signal is applied to each of the pixel electrodes 53a. Thus, an electric field is formed between each of the pixel electrodes 53a and the transparent conductive film 58. When the electric field is formed, in the liquid crystal layer 56, the arrangement direction of the liquid crystal molecules 216a changes for each region corresponding to each of the pixel electrodes 53a, and the refractive index changes for each region corresponding to each of the pixel electrodes 53a. This state is a state in which the modulation pattern is displayed on the liquid crystal layer 56.

When, in a state where the modulation pattern is displayed on the liquid crystal layer 56, the laser light L enters into the liquid crystal layer 56 from the outside through the transparent substrate 59 and the transparent conductive film 58, is reflected by the reflective film 54, and then is emitted to the outside from the liquid crystal layer 56 through the transparent conductive film 58 and the transparent substrate 59, the laser light L is modulated in accordance with the modulation pattern displayed on the liquid crystal layer 56. As described above, according to the spatial light modulator 5, it is possible to modulate (for example, modulation of intensity, amplitude, phase, polarization, and the like of the laser light L) the laser light L by appropriately setting the modulation pattern to be displayed on the liquid crystal layer 56.

[Configuration of Object]

Figure 3:
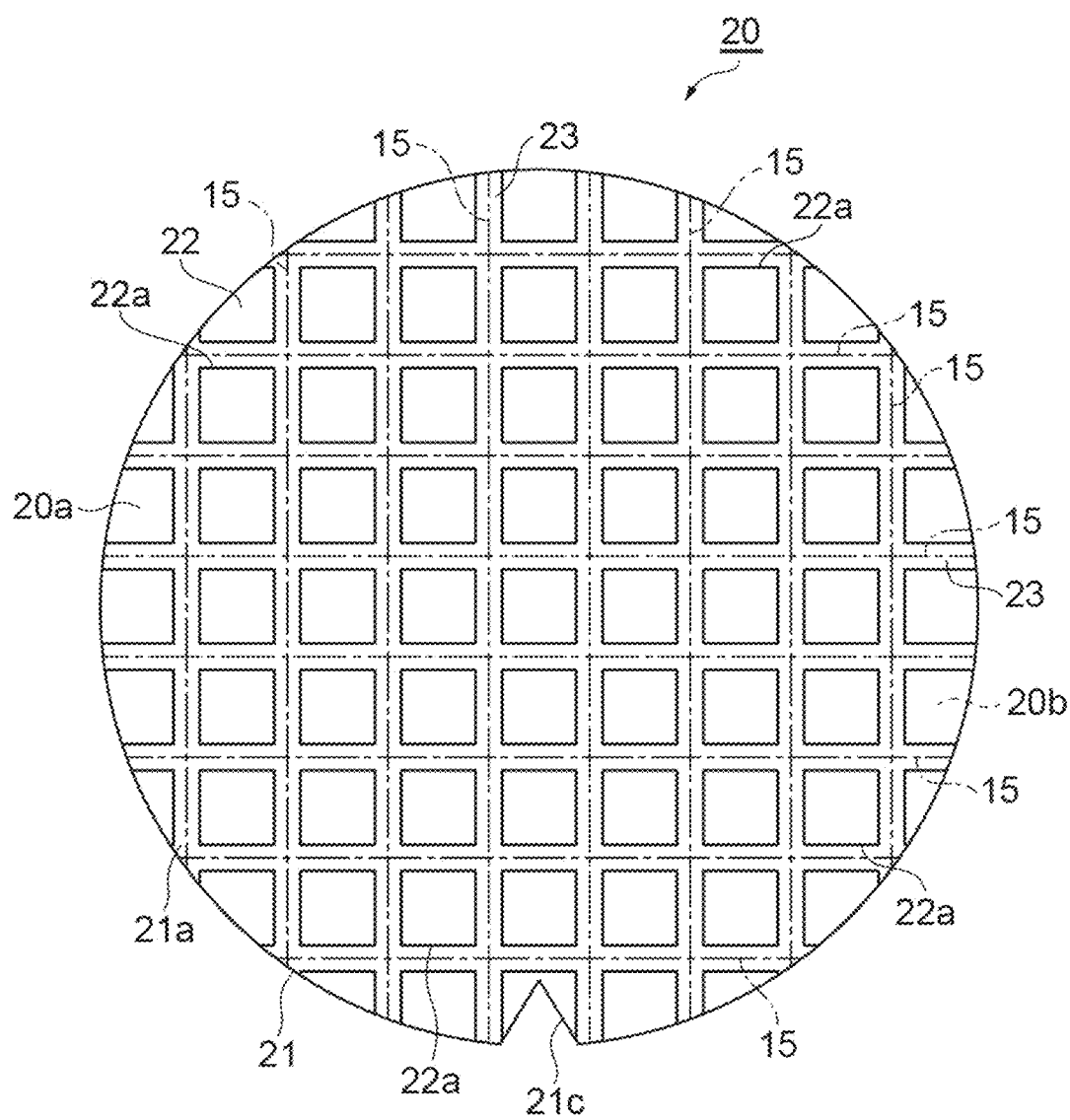
FIG. 3 is a plan view of a wafer which is an object in the embodiment.
Figure 4:
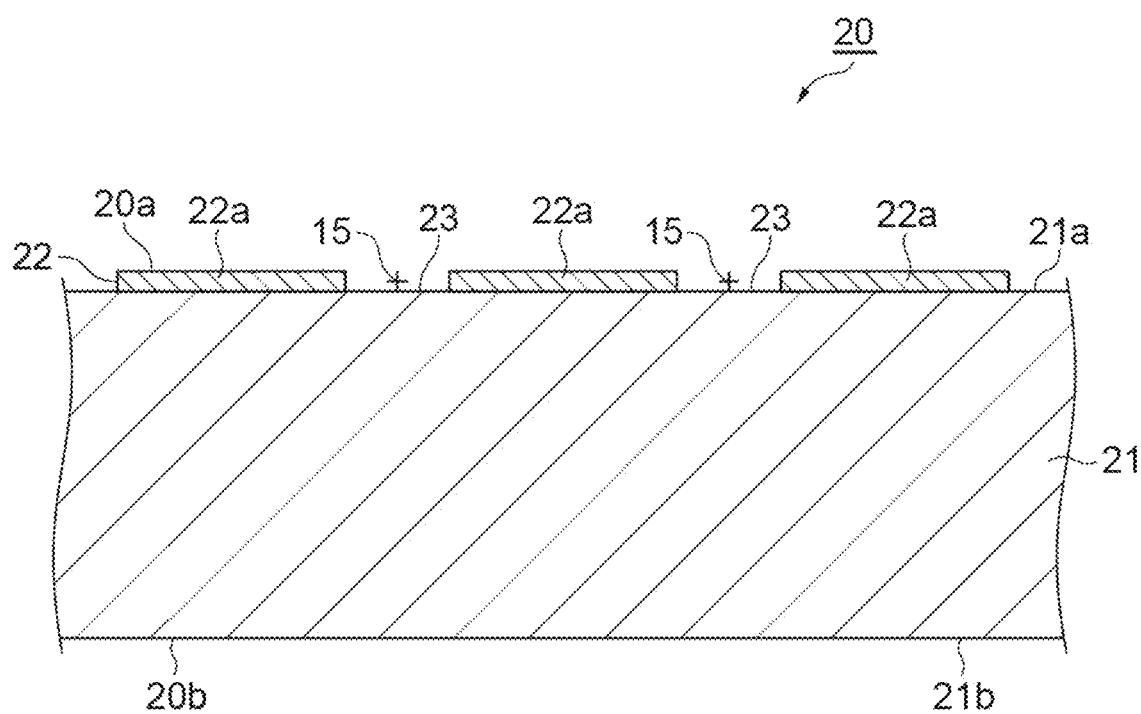
FIG. 4 is a cross-sectional view illustrating a portion of the wafer illustrated in FIG. 3.

The object 11 in the present embodiment is a wafer 20 as illustrated in FIGS. 3 and 4. The wafer 20 has a first surface 20a and a second surface 20b on an opposite side of the first surface 20a. The wafer 20 is configured by stacking a functional element layer 22 on a semiconductor substrate 21.

The semiconductor substrate 21 is, for example, a silicon substrate. The semiconductor substrate 21 has a first surface 21a and a second surface 21b on an opposite side of the first surface 21a. The second surface 21b corresponds to the second surface 20b of the wafer 20. A notch 21c indicating a crystal orientation is provided in the semiconductor substrate 21. The semiconductor substrate 21 may be provided with an orientation flat instead of the notch 21c.

The functional element layer 22 is formed on the first surface 21a of the semiconductor substrate 21. The functional element layer 22 includes a plurality of functional elements 22a arranged in a matrix along the first surface 21a of the semiconductor substrate 21. Each of the functional elements 22a is, for example, a light receiving element such as a photodiode, a light emitting element such as a laser diode, a circuit element such as a memory, or the like. Each of the functional elements 22a may be configured three-dimensionally by stacking a plurality of layers.

The wafer 20 is cut into functional elements 22a along each of a plurality of lines 15. The plurality of lines 15 extend in a lattice shape along the second surface 21b of the wafer 20 to pass between the plurality of functional elements 22a (more specifically, the center of a street region 23 extending to pass between the adjacent functional elements 22a) when viewed from a thickness direction of the wafer 20. Each line 15 is a virtual line set on the wafer 20 by the laser processing apparatus 1. Each line 15 may be a line actually drawn on the wafer 20.

[Operation of Laser Processing Apparatus and Laser Processing Method]

Figure 5:
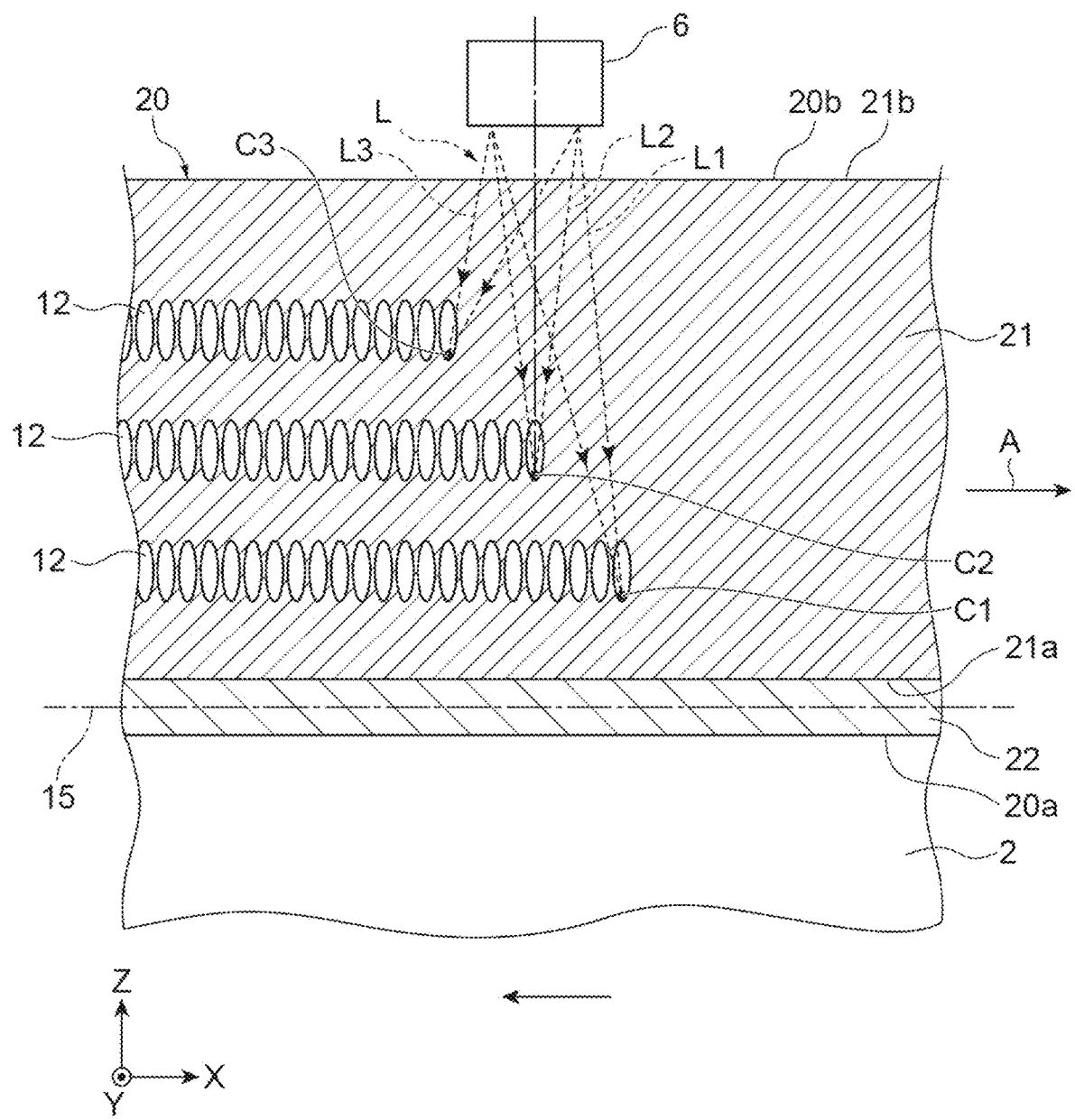
FIG. 5 is a cross-sectional view illustrating a wafer for explaining a three-point branch laser processing method.

As illustrated in FIG. 5, in the laser processing apparatus 1, the wafer 20 is supported by the support part 2 so that the second surface 20b of the wafer 20 is perpendicular to the Z direction. The controller 10 controls the spatial light modulator 5, and a predetermined modulation pattern (for example, a modulation pattern including a diffraction pattern) is displayed on the liquid crystal layer 56 of the spatial light modulator 5. In this state, the laser light L is emitted from the light source 3, and the laser light L is converged on the wafer 20 from the second surface 20b side by the converging part 6. That is, the laser light L is modulated by the spatial light modulator 5, and the modulated laser light L is converged on the wafer 20 from the second surface 20b side by the converging part 6.

Thus, the laser light L is branched (diffracted) into a plurality of rays of processing light L1, L2, and L3 including 0th-order light. A plurality of converging points C1, C2, and C3 of the plurality of rays of processing light L1, L2, and L3 are located at positions different from each other in each of the Z direction and the X direction. In the present embodiment, the processing light L2 is the 0th-order light. The converging point C1 of the processing light L1 is located on the front side of the converging point C2 of the processing light L2 being the 0th-order light, in the relative movement direction A of the laser light L. The converging point C3 of the processing light L3 is located on the rear side of the converging point C2 of the processing light L2 being the 0th-order light, in the relative movement direction A of the laser light L. As an example, the processing light L1 is +1st-order light, and the processing light L3 is −1st-order light.

In the present embodiment, the laser light L is modulated by the spatial light modulator 5 so that the plurality of converging points C1, C2, and C3 have a positional relation of being located closer to the first surface 20a of the wafer 20 in the Z direction toward the front side in the relative movement direction A of the laser light L. That is, the laser light L is modulated by the spatial light modulator 5 so that the converging point C2 is located on the first surface 20a side of the wafer 20 in the Z direction with respect to the converging point C3 and the converging point C1 is located on the first surface 20a side of the wafer 20 in the Z direction with respect to the converging point C2. Furthermore, in the present embodiment, the laser light L is modulated by the spatial light modulator 5 so that the processing light L1 branched on the foremost side in the relative movement direction A of the laser light L among the plurality of rays of processing light L1, L2, and L3 has the largest output (energy, intensity). A case where processing light having the output equal to the output of the processing light L1 is provided among the plurality of rays of processing light L1, L2, and L3, but the outputs of the other rays of processing light are less than the output of the processing light L1 is included in the case where the processing light L1 has the largest output.

In a state where the laser light L is branched into the plurality of rays of processing light L1, L2, and L3 including the 0th-order light, the controller 10 controls the support part 2 so that the X direction coincides with an extension direction of the line 15 and the plurality of converging points C1, C2, and C3 move relatively along the line 15. Thus, three rows of modified regions 12 are formed along one line 15. The distances from the second surface 20b of the wafer 20 to the respective modified regions 12 are different from each other. The depth at which each of the modified regions 12 is formed corresponds to the depth at which the converging points C1, C2, and C3 are combined.

Here, the influence of the non-modulated light of the laser light L will be described. The non-modulated light of the laser light L refers to light emitted from the spatial light modulator 5 without being modulated by the spatial light modulator 5 among rays of the laser light L entering into the spatial light modulator 5. For example, light reflected on the outer surface of the transparent substrate 59 (surface on an opposite side of the transparent conductive film 58) among rays of laser light L entering into the spatial light modulator 5 becomes the non-modulated light.

Figure 6:
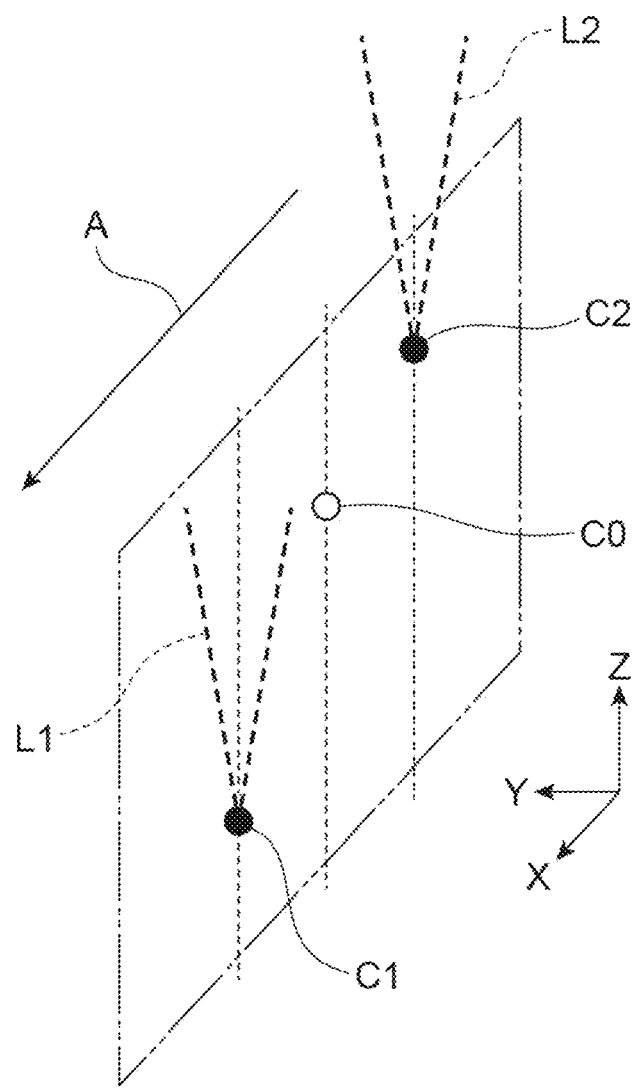
FIG. 6 is a schematic diagram illustrating a two-point branch laser processing method.

As illustrated in FIG. 6, in a case where the laser light L is branched into two rays of processing light L1 and L2 by diffraction, when the processing light L1 is +1st-order light and the processing light L2 is −1st-order light, two converging points C1 and C2 of the two rays of processing light L1 and L2 are separated from a converging point C0 of non-modulated light. Therefore, the two rays of processing light L1 and L2 are less likely to be influenced by the non-modulated light. As a result, two rows of modified regions 12 are easily formed in a desired state.

Figure 7:
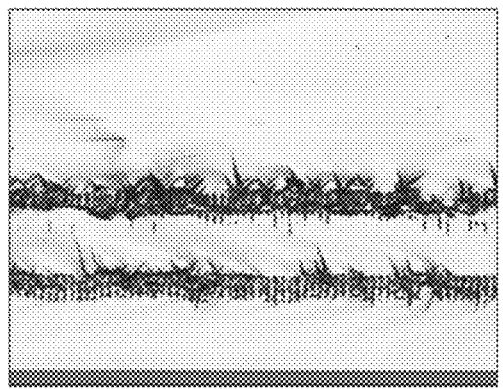
FIG. 7 is an image of a cut surface of a silicon substrate on which the two-point branch laser processing method has been performed.

FIG. 7 is an image of a cut surface of a silicon substrate on which the two-point branch laser processing method as illustrated in FIG. 6 has been performed. In the example illustrated in FIG. 7, no black streak appears in a region along the surface of the silicon substrate on an opposite side of the entering side of the laser light L (the lower surface of the silicon substrate illustrated in FIG. 7) and a region between the adjacent modified regions 12. This indicates that a fracture sufficiently extends from the two rows of modified regions 12 through the surface of the silicon substrate on the opposite side of the entering side of the laser light L.

Figure 8:
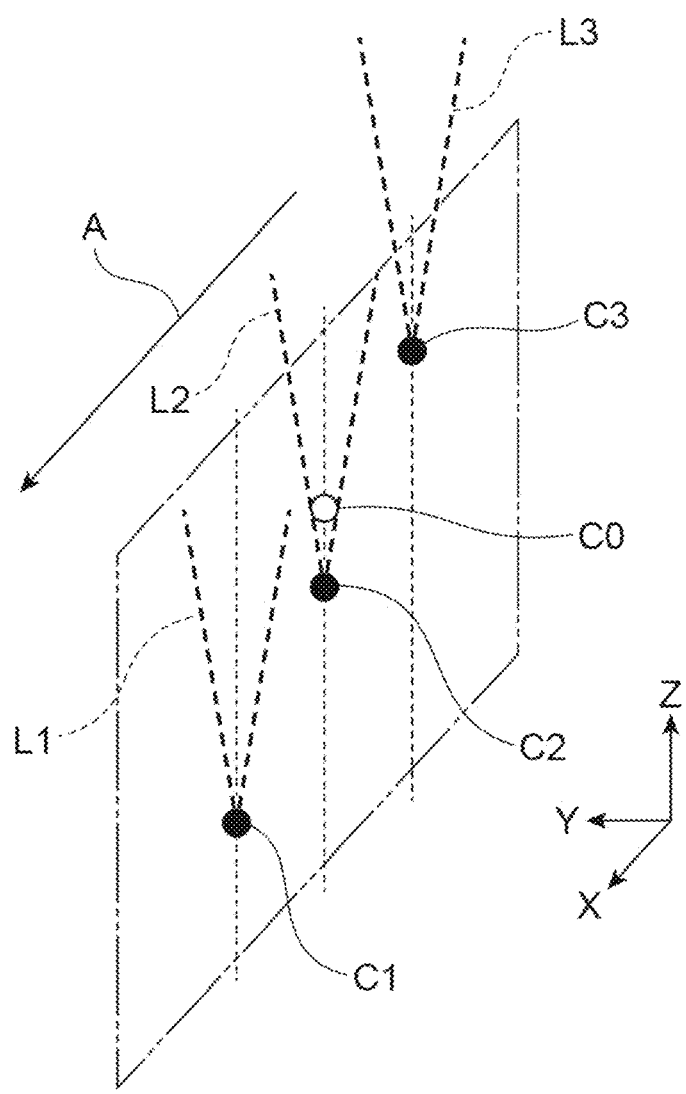
FIG. 8 is a schematic diagram illustrating the three-point branch laser processing method.

On the other hand, as illustrated in FIG. 8, in a case where the laser light L is branched into three rays of processing light L1, L2, and L3 by diffraction, when the processing light L1 is +1st-order light, the processing light L2 is the 0th-order light, and the processing light L3 is −1st-order light, two converging points C1 and C3 of the two rays of processing light L1 and L3 are separated from a converging point C0 of non-modulated light, but a converging point C2 of the processing light L2 approaches the converging point C0 of the non-modulated light. The converging point C2 of the processing light L2 is separated from the converging point C0 of the non-modulated light mainly by the correction amount of the spherical aberration correction. Therefore, the processing light L2 is likely to be influenced by the non-modulated light. As a result, it is difficult to form three rows of modified regions 12 in a desired state.

Figure 9:
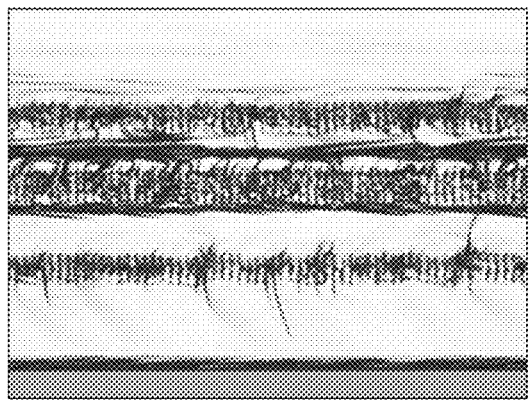
FIG. 9 is an image of a cut surface of a silicon substrate on which the three-point branch laser processing method has been performed.

FIG. 9 is an image of a cut surface of a silicon substrate on which the three-point branch laser processing method as illustrated in FIG. 8 has been performed. In the example illustrated in FIG. 9, a black streak appears in a region along the surface of the silicon substrate on an opposite side of the entering side of the laser light L (the lower surface of the silicon substrate illustrated in FIG. 9) and a region between the adjacent modified regions 12. This indicates that a fracture does not sufficiently extend from the three rows of modified regions 12 through the surface of the silicon substrate on the opposite side of the entering side of the laser light L (in particular, the fracture does not reach the surface of the silicon substrate on the opposite side of the entering side of the laser light L).

Based on the above knowledge, in the laser processing apparatus 1, at least one of a laser processing method of an X-direction shift, a laser processing method of a Y-direction shift, and a laser processing method of a Z-direction shift is performed.

Figure 10:
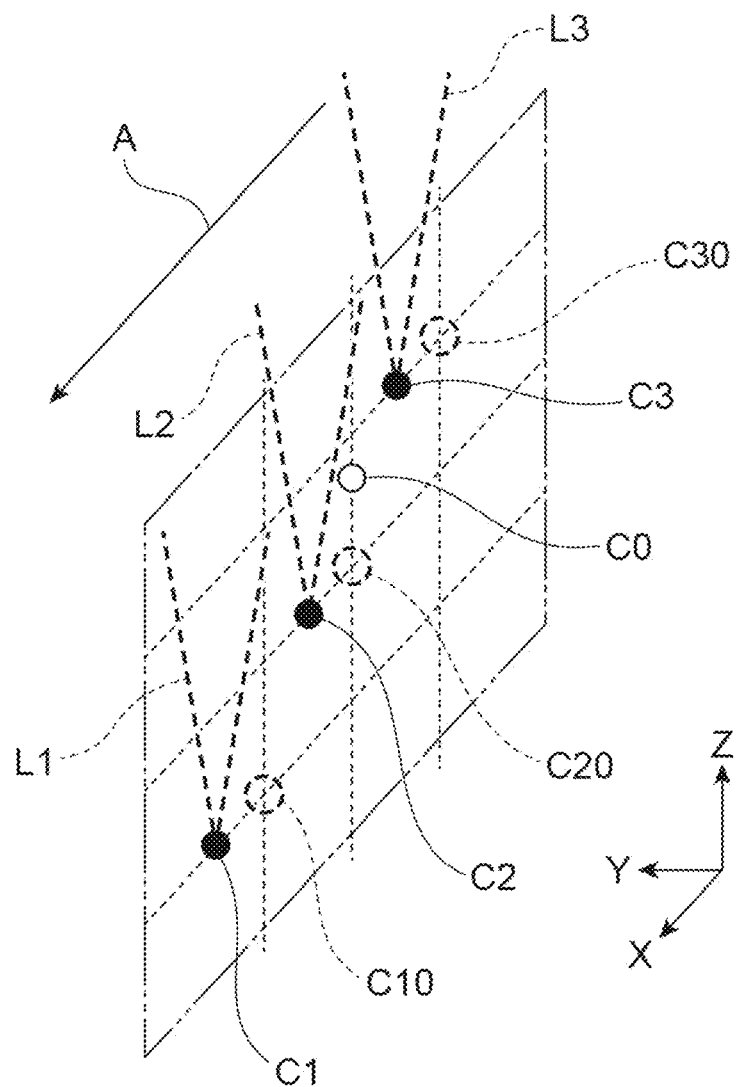
FIG. 10 is a schematic diagram illustrating a laser processing method of an X-direction shift.

In the laser processing method of the X-direction shift, as illustrated in FIG. 10, the controller 10 controls the spatial light modulator 5 so that the converging point C2 of the processing light L2 being the 0th-order light is located on one side (that is, the front side or the rear side in the relative movement direction A of the laser light L) with respect to the converging point C0 of the non-modulated light in the X direction. In the present embodiment, the controller 10 controls the spatial light modulator 5 so that the converging point C1 of the processing light L1 is located on the front side of a converging point C10 in the relative movement direction A of the laser light L, the converging point C2 of the processing light L2 is located on the front side of a converging point C20 in the relative movement direction A of the laser light L, and the converging point C3 of the processing light L3 is located on the front side of a converging point C30 in the relative movement direction A of the laser light L. The converging points C10, C20, and C30 correspond to the converging points of the rays of processing lights L1, L2, and L3 in a case where the X-direction shift is not performed in the modulation of the laser light L.

FIG. 11 is a view illustrating an experimental result on the laser processing method of the X-direction shift. In FIG. 11, a "shift amount" indicates a "distance between the converging point C0 of the non-modulated light and the converging point C2 of the processing light L2 being the 0th-order light" in the X direction. "−" indicates a shift to the front side in the relative movement direction A of the laser light L. "+" indicates a shift to the rear side in the relative movement direction A of the laser light L. In this experiment, three rows of modified regions 12 were formed on a silicon substrate having an electrical resistivity of 1 Ω·cm or more, a crystal orientation (100), and a thickness of 775 μm under conditions as follows, by changing only the shift amount in the X direction.

Wavelength of laser light L: 1099 nm
Pulse width of laser light L: 700 ns
Repetition frequency of laser light L: 70 kHz
Relative movement speed of laser light L with respect to silicon substrate: 500 mm/s
Output of each of rays of processing light L1, L2, and L3: 2.0 W
Formation depth of modified region 12 by processing light L1: 694 μm
Formation depth of modified region 12 by processing light L2: 630 μm
Formation depth of modified region 12 by processing light L3: 566 μm
Distance between converging points C1 and C2 in X direction: 55 μm
Distance between converging points C2 and C3 in X direction: 55 μm The results of this experiment are as in "cross-sectional picture (image of cut surface of silicon substrate)" and "result" illustrated in FIG. 11. Regarding the "cross-sectional picture", an evaluation was performed from the viewpoint of "whether or not a fracture sufficiently extends from the three rows of modified regions 12 through the surface of the silicon substrate on the opposite side of the entering side of the laser light L (the lower surface of the silicon substrate illustrated in the "cross-sectional picture" in FIG. 11)". A case where the fracture extended was evaluated as "C". A case where the fracture extended sufficiently was evaluated as "B". A case where the fracture extends more sufficiently was evaluated as "A". In this experiment, it has been understood that it is preferable to locate the converging point C2 of the processing light L2 being the 0th-order light on the front side in the relative movement direction A of the laser light L with respect to the converging point C0 of the non-modulated light, and it is preferable to set the shift amount in the X direction in this case to be equal to or more than 2 μm.

Figure 12:
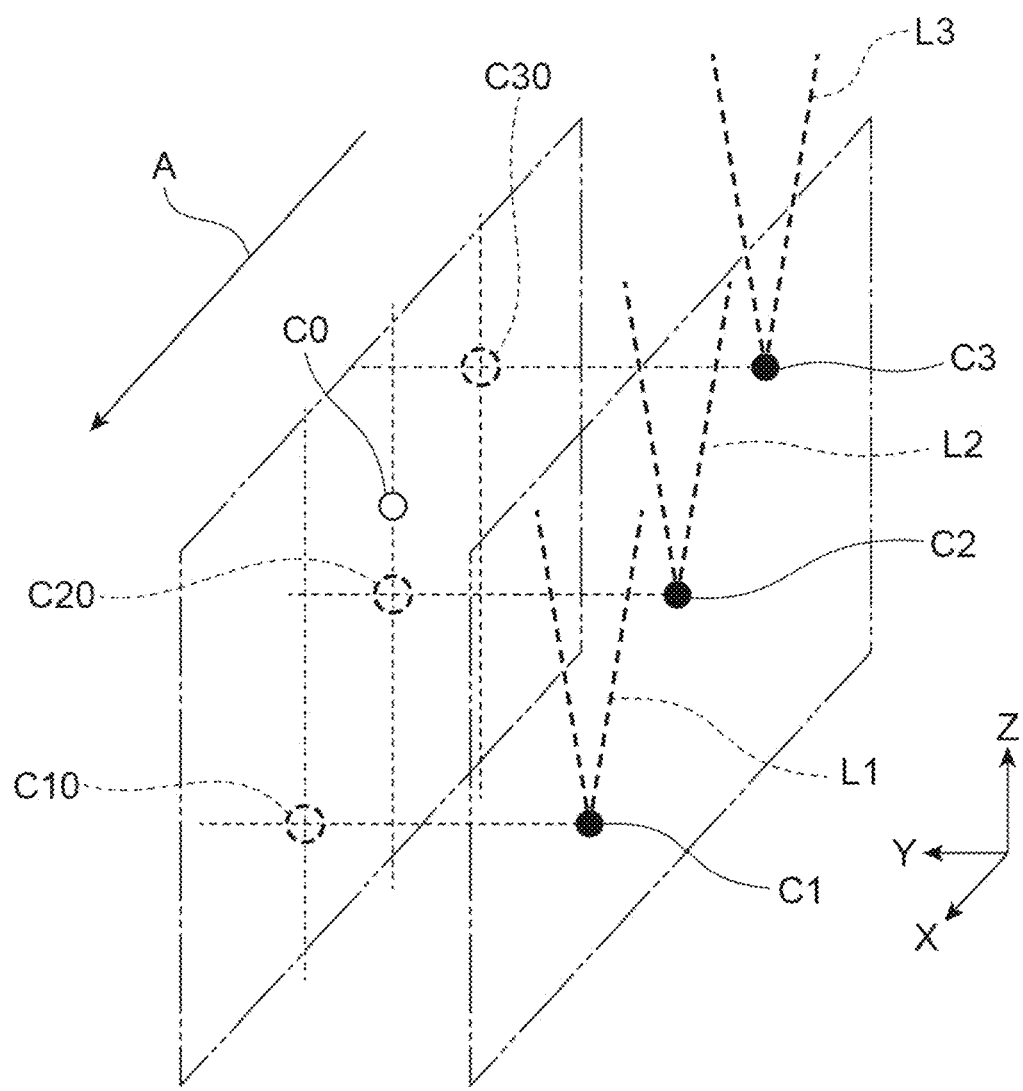
FIG. 12 is a schematic diagram illustrating a laser processing method of a Y-direction shift.

In the laser processing method of the Y-direction shift, as illustrated in FIG. 12, the controller 10 controls the spatial light modulator 5 so that the converging point C2 of the processing light L2 being the 0th-order light is located on one side with respect to the converging point C0 of the non-modulated light in the Y direction. In the present embodiment, the controller 10 controls the spatial light modulator 5 so that the converging point C1 of the processing light L1 is located on one side with respect to the converging point C10 in the Y direction, the converging point C2 of the processing light L2 is located on one side with respect to the converging point C20 in the Y direction, and the converging point C3 of the processing light L3 is located on one side with respect to the converging point C30 in the Y direction (that is, the plurality of converging points C1, C2, and C3 of the plurality of rays of processing light L1, L2, and L3 are located on one side (the same side) with respect to the converging point C0 of the non-modulated light in the Y direction). The converging points C10, C20, and C30 correspond to the converging points of the rays of processing lights L1, L2, and L3 in a case where the Y-direction shift is not performed in the modulation of the laser light L.

FIG. 13 is a view illustrating an experimental result on the laser processing method of the Y-direction shift. In FIG. 13, the "shift amount" refers to a "distance between the converging point C0 of the non-modulated light and the converging point C2 of the processing light L2 being the 0th-order light" in the Y direction. In this experiment, three rows of modified regions 12 were formed on a silicon substrate having an electrical resistivity of 1 Ω·cm or more, a crystal orientation (100), and a thickness of 775 μm under the same conditions as the conditions in the laser processing method of the X-direction shift, by changing only the shift amount in the Y direction.

The results of this experiment are as in "cross-sectional picture (image of cut surface of silicon substrate)" and "result" illustrated in FIG. 13. Regarding the "cross-sectional picture", an evaluation was performed from the above-described viewpoint. A case where the fracture extended was evaluated as "C". A case where the fracture extended sufficiently was evaluated as "B". A case where the fracture extends more sufficiently was evaluated as "A". In this experiment, it has been understood that it is preferable to set the shift amount in the Y direction to be equal to or more than 4 μm.

Figure 14:
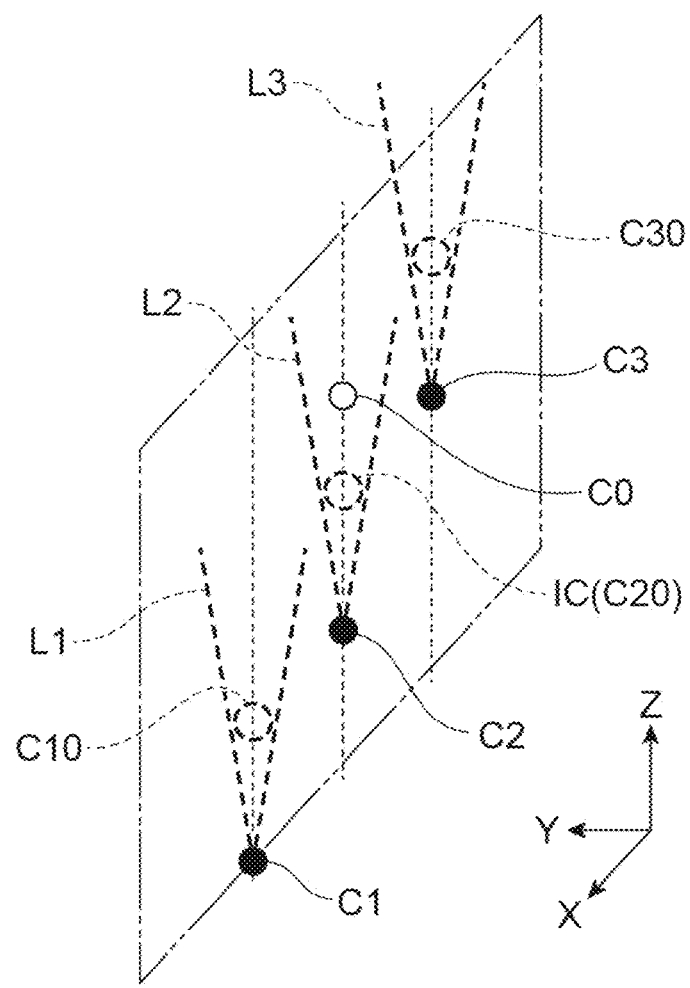
FIG. 14 is a schematic diagram illustrating a laser processing method of a Z-direction shift.

In the laser processing method of the Z-direction shift, as illustrated in FIG. 14, the controller 10 controls the spatial light modulator 5 so that the converging point C2 of the processing light L2 being the 0th-order light is located on an opposite side of the converging point C0 of the non-modulated light (that is, the "emission side of the processing light L2" in the Z direction) with respect to an ideal converging point IC of the 0th-order light in the Z direction. Alternatively, the controller 10 controls the spatial light modulator 5 so that the converging point C2 of the processing light L2 being the 0th-order light is located on an opposite side of the ideal converging point IC of the 0th-order light (that is, the "entering side of the processing light L2" in the Z direction) with respect to the converging point C0 of the non-modulated light in the Z direction. The ideal converging point IC of the 0th-order light is a converging point of the 0th-order light in a case where it is assumed that there is no spherical aberration and the 0th-order light is converged at one point in the object. As an example, the ideal converging point IC substantially coincides with the converging point C20. In the present embodiment, the controller 10 controls the spatial light modulator 5 so that the converging point C1 of the processing light L1 is located on the emission side of the processing light L1 with respect to the converging point C10 in the Z direction, the converging point C2 of the processing light L2 is located on the emission side of the processing light L2 with respect to the converging point C20 in the Z direction, and the converging point C3 of the processing light L3 is located on the emission side of the processing light L3 with respect to the converging point C30 in the Z direction. The converging points C10, C20, and C30 correspond to the converging points of the rays of processing lights L1, L2, and L3 in a case where the Z-direction shift is not performed in the modulation of the laser light L.

FIG. 15 is a view illustrating an experimental result on the laser processing method of the Z-direction shift. In FIG. 15, the "shift amount" refers to a "distance between the ideal converging point IC of the 0th-order light and the converging point C2 of the processing light L2 being the 0th-order light" in the Z direction. "−" indicates a shift to the "entering side of the processing light L2" in the Z direction, and "+" indicates a shift to the "emission side of the processing light L2" in the Z direction. In FIG. 15, the "distance" refers to a "distance between the converging point C0 of the non-modulated light and the converging point C2 of the processing light L2 being the 0th-order light" in the Z direction. In this experiment, three rows of modified regions 12 were formed on a silicon substrate having an electrical resistivity of 1 Ω·cm or more, a crystal orientation (100), and a thickness of 775 μm under the same conditions as the conditions in the laser processing method of the X-direction shift, by changing only the shift amount in the Z direction.

The results of this experiment are as in "cross-sectional picture (image of cut surface of silicon substrate)" and "result" illustrated in FIG. 15. Regarding the "cross-sectional picture", an evaluation was performed from the above-described viewpoint. A case where the fracture extended was evaluated as "C". A case where the fracture extended sufficiently was evaluated as "B". A case where the fracture extends more sufficiently was evaluated as "A". In this experiment, it has been understood that it is preferable to locate the converging point C2 of the processing light L2 being the 0th-order light on the opposite side of the entering side of the processing light L2 with respect to the ideal converging point IC of the 0th-order light, and it is preferable to set the shift amount in the Z direction in this case to be equal to or more than 20 μm.

FIG. 16 is a diagram illustrating experimental results on a laser processing method of a combination of the Z-direction shift and the Y-direction shift and a laser processing method of a combination of the Z-direction shift and the X-direction shift. In FIG. 16, a numerical value in the "Z-direction shift" refers to a shift amount in the Z direction (that is, a "distance between the ideal converging point IC of the 0th-order light and the converging point C2 of the processing light L2 being the 0th-order light" in the Z direction). "+" indicates a shift to the "emission side of the processing light L2" in the Z direction. A numerical value in the "Y-direction shift" refers to a shift amount in the Y direction (that is, a "distance between the converging point C0 of the non-modulated light and the converging point C2 of the processing light L2 being the 0th-order light" in the Y direction). A numerical value in the "X-direction shift" refers to a shift amount in the X direction (that is, a "distance between the converging point C0 of the non-modulated light and the converging point C2 of the processing light L2 being the 0th-order light" in the X direction). "−" indicates a shift to the front side in the relative movement direction A of the laser light L. "+" indicates a shift to the rear side in the relative movement direction A of the laser light L.

As described above, the laser processing method may be performed by combining the Z-direction shift and the Y-direction shift, or the laser processing method may be performed by combining the Z-direction shift and the X-direction shift. The laser processing method may be performed by combining the X-direction shift and the Y-direction shift, or the laser processing method may be performed by combining the X-direction shift, the Y-direction shift, and the Z-direction shift.

[Operation of Laser Processing Apparatus and Laser Processing Method of X-Direction Shift]

The laser processing method of the X-direction shift, which is performed by the laser processing apparatus 1, will be described in more detail with reference to the flowchart illustrated in FIG. 17.

Figure 17:
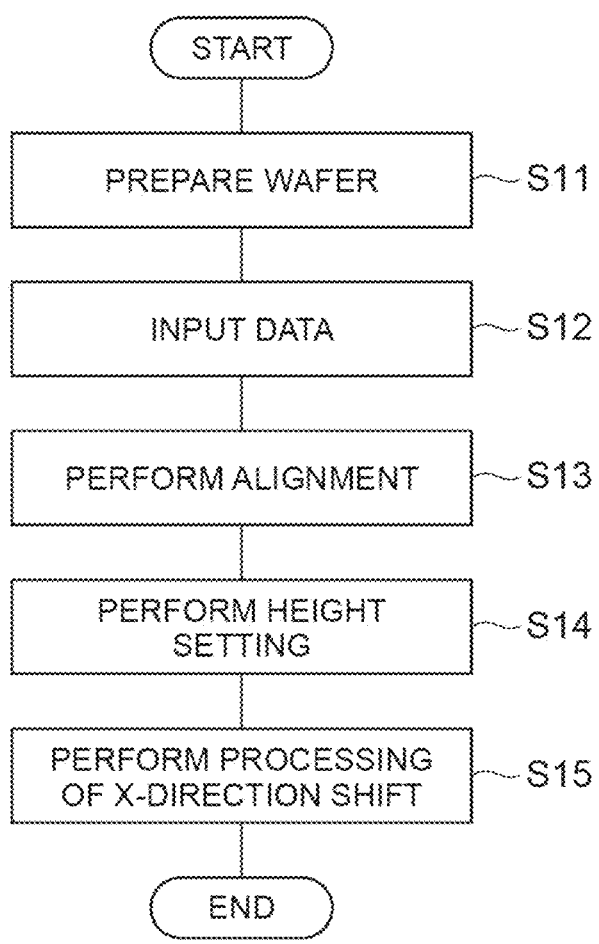
FIG. 17 is a flowchart illustrating the laser processing method of the X-direction shift.

First, a wafer 20 is prepared (S11 illustrated in FIG. 17, first step). Specifically, as illustrated in FIG. 5, the wafer 20 is supported by the support part 2 so that the second surface 20b of the wafer 20 is perpendicular to the Z direction.

Then, data is input to the laser processing apparatus 1 (S12 illustrated in FIG. 17). Specifically, as illustrated in (a) of FIG. 18, various types of data input by the operator are received by the input reception part 103 (see FIG. 1) of the controller 10. In (a) of FIG. 18, "SD1" indicates processing light L1, "SD2" indicates processing light L2, and "SW" indicates processing light L3. The operator can input the "number of branches" and a "shift direction", numerical values related to the rays of processing light L1, L2, and L3, and the like.

In this example, "3" is input as the "number of branches", and "X direction" is input as the "shift direction". That is, the laser processing method of the X-direction shift in a state where the laser light L is branched into three rays of processing lights L1, L2, and L3 is selected. Among the numerical values and the like related to the rays of processing light L1, L2, and L3, "ZH" indicates falling amounts (in this example, Z1, Z2, and Z3) when the converging points C1, C2, and C3 fall down from the second surface 20b of the wafer 20. "1" input as "BP" indicates the type of combination of various beam parameters. "Reference" input as "spherical aberration" indicates the correction amount of the spherical aberration of each ray of the processing lights L1, L2, and L3.

In the input reception part 103, the input of the "output" of each ray of the processing light L1, L2, and L3 may be restricted so that the processing light L1 branched on the foremost side in the relative movement direction A of the laser light L among the plurality of rays of processing light L1, L2, and L3 has the largest output. Furthermore, in the input reception part 103, each of the "spherical aberration" and "BP" may be input for each ray of the processing light L1, L2, and L3. In the input reception part 103, the formation depth of the modified region 12 by each ray of the processing light L1, L2, and L3 (that is, a value corresponding to the distance from the second surface 20b to each modified region 12) may be input instead of "ZH" or together with "ZH".

The storage part 102 (see FIG. 1) in the controller 10 stores pieces of data of a "reference SD", an "X-direction branch amount", and an "X-direction shift amount" as data in a case where the laser processing method of the X-direction shift in a state where the laser light L is branched into three rays of processing light L1, L2, and L3 is selected, as illustrated in (b) of FIG. 18.

The "reference SD" indicates a reference when the converging points C1, C2, and C3 fall down from the second surface 20b of the wafer 20. "SD2" input as the "reference SD" indicates that the converging point C2 of the processing light L2 is the reference (the converging point C1 of the processing light L1 or the converging point C3 of the processing light L3 may be used as the reference). The "X-direction branch amount" indicates a "distance between the converging point C1 of the processing light L1 and the converging point C3 of the processing light L3" (in this example, X10) in the X direction. In this case, as an example, a "distance between the converging point C1 of the processing light L1 and the converging point C2 of the processing light L2" in the X direction becomes X10/2, and a "distance between the converging point C2 of the processing light L2 and the converging point C3 of the processing light L3" in the X direction becomes X10/2. The "X-direction shift amount" indicates the shift amount (in this example, X1) in the X direction, that is, a "distance between the converging point C0 of the non-modulated light and the converging point C2 of the processing light L2 being the 0th-order light" in the X direction.

Then, alignment is performed in the laser processing apparatus 1 (S13 illustrated in FIG. 17). Thus, the converging point C of the laser light L is located on the line 15 when viewed from the Z direction. Then, the height setting is performed in the laser processing apparatus 1 (S14 illustrated in FIG. 17). Thus, as illustrated on the left side of FIG. 19, the converging point C of the laser light L is located on the laser light entering surface (that is, the second surface 20b of the wafer 20).

Figure 19:
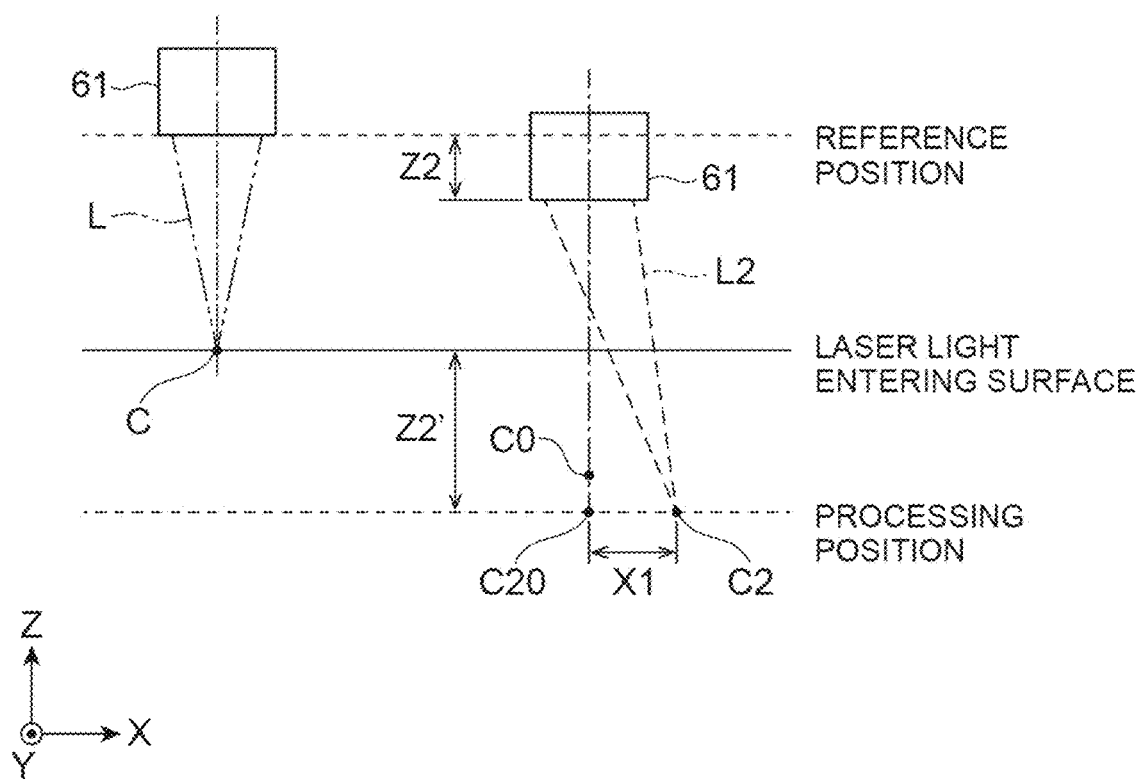
FIG. 19 is a diagram illustrating the laser processing method of the X-direction shift.

As illustrated on the right side of FIG. 19, with the converging point C2 of the processing light L2 as a reference, the converging lens unit 61 (see FIG. 1) of the converging part 6 falls by Z2. Thus, the plurality of converging points C1, C2, and C3 of the plurality of rays of processing light L1, L2, and L3 are positioned with respect to the wafer 20 so that a "distance between the laser light entering surface and the converging point C2 of the processing light L2" in the Z direction becomes Z2' (a value corresponding to a value obtained by multiplying Z2 by the refractive index of the wafer 20), and a "distance between the converging point C0 of the non-modulated light and the converging point C2 of the processing light L2" in the X direction becomes X1.

As described above, in the laser processing apparatus 1, before the laser light L is emitted from the light source 3, the controller 10 controls the support part 2 and the housing H (that is, the converging part 6) based on an image acquired by the visible image capturing part 8, so that the converging point C2 of the processing light L2 being the 0th-order light is located at a predetermined depth from the second surface 20b of the wafer 20.

Then, the laser light L is emitted from the light source 3, and the laser light L is modulated by the spatial light modulator 5 (see FIG. 1). Then, the modulated laser light L (that is, a plurality of rays of processing light L1, L2, and L3) is converged on the wafer 20 (see FIG. 5) from the second surface 20b side (S15 illustrated in FIG. 17, second step). Specifically, the controller 10 controls the spatial light modulator 5 so that the laser light L is branched into the plurality of rays of processing light L1, L2, and L3 including the 0th-order light, and the plurality of converging points C1, C2, and C3 of the plurality of rays of processing light L1, L2, and L3 are located at positions different from each other in each of the Z direction and the X direction. Further, the controller 10 controls the spatial light modulator 5 so that the converging point C2 of the processing light L2 being the 0th-order light is located on one side with respect to the converging point C0 of the non-modulated light in the X direction. The plurality of converging points C1, C2, and C3 are relatively moved along the line 15 in a state where the X direction coincides with the extension direction of the line 15.

As described above, in the laser processing apparatus 1, the converging point C2 of the processing light L2 being the 0th-order light is located on one side with respect to the converging point C0 of the non-modulated light in the X direction. Thus, the occurrence of a situation in which the non-modulated light that is not modulated by the spatial light modulator 5 among rays of the laser light L has an influence on a converging state of the processing light L2 being the 0th-order light (for example, the non-modulated light interferes with the processing light L2 being the 0th-order light) is prevented. Thus, according to the laser processing apparatus 1 (and the laser processing method of X-direction shift), it is possible to obtain high processing quality in processing of branching the laser light L into the plurality of rays of processing light L1, L2, and L3.

In addition, in the laser processing apparatus 1, the controller 10 controls the spatial light modulator 5 so that the converging point C2 of the processing light L2 being the 0th-order light is located on the front side of the converging point C0 of the non-modulated light in the relative movement direction A of the laser light L. Thus, in a case where the converging point C2 of the processing light L2 being the 0th-order light is located on one side with respect to the converging point C0 of the non-modulated light in the X direction, it is possible to obtain higher processing quality.

In the laser processing apparatus 1, the controller 10 controls the spatial light modulator 5 so that the plurality of converging points C1, C2, and C3 of the plurality of rays of processing lights L1, L2, and L3 have a positional relation of being located closer to the first surface 20a of the wafer 20 in the Z direction toward the front side in the relative movement direction A of the laser light L. Thus, it is possible to suppress inhibition of converging of each of the plurality of rays of processing light L1, L2, and L3 by the formed modified region 12.

In addition, in the laser processing apparatus 1, the controller 10 controls the spatial light modulator 5 so that the processing light branched on the foremost side in the relative movement direction A of the laser light L among the plurality of rays of processing light L1, L2, and L3 has the largest output. Thus, in a case where a fracture extending through a plurality of rows of modified regions 12 is formed on the wafer 20, it is possible to largely extend the fracture to the first surface 20a side of the wafer 20.

[Operation of Laser Processing Apparatus and Laser Processing Method of Y-Direction Shift]

The laser processing method of the Y-direction shift, which is performed by the laser processing apparatus 1, will be described in more detail with reference to the flowchart illustrated in FIG. 20.

Figure 20:
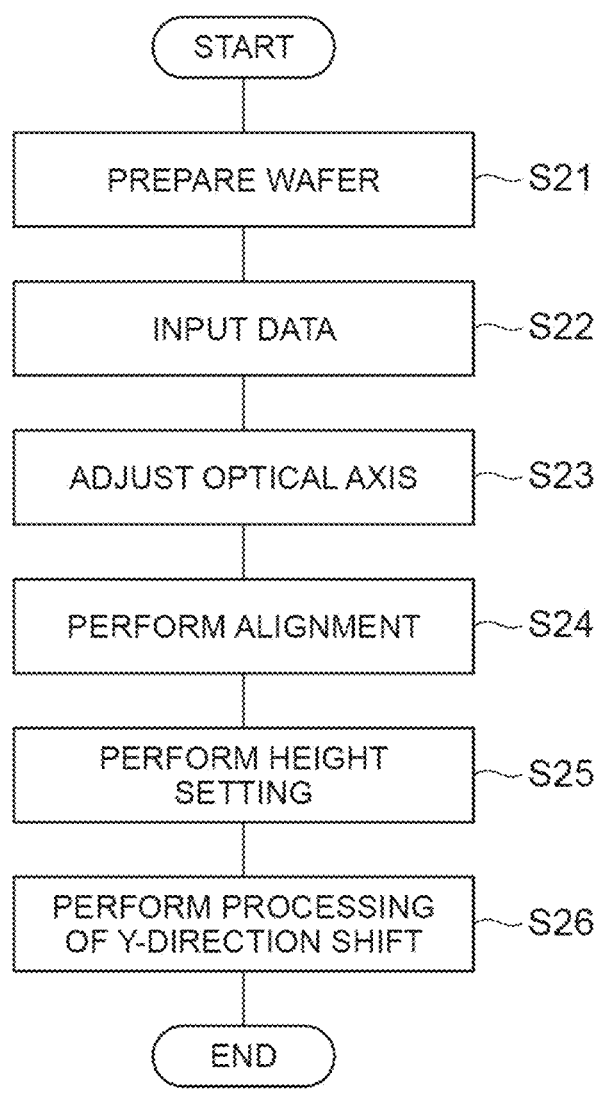
FIG. 20 is a flowchart illustrating the laser processing method of the Y-direction shift.

First, a wafer 20 is prepared (S21 illustrated in FIG. 20, first step). Specifically, as illustrated in FIG. 5, the wafer 20 is supported by the support part 2 so that the second surface 20b of the wafer 20 is perpendicular to the Z direction.

Then, data is input to the laser processing apparatus 1 (S22 illustrated in FIG. 20). Specifically, as illustrated in (a) of FIG. 21, various types of data input by the operator are received by the input reception part 103 (see FIG. 1) of the controller 10. In (a) of FIG. 21, "SD1" indicates processing light L1, "SD2" indicates processing light L2, and "SD3" indicates processing light L3. The operator can input the "number of branches" and a "shift direction", numerical values related to the rays of processing light L1, L2, and L3, and the like.

In this example, "3" is input as the "number of branches", and "Y direction" is input as the "shift direction". That is, the laser processing method of the Y-direction shift in a state where the laser light L is branched into three rays of processing lights L1, L2, and L3 is selected. Among the numerical values and the like related to the rays of processing light L1, L2, and L3, "ZH" indicates falling amounts (in this example, Z1, Z2, and Z3) when the converging points C1, C2, and C3 fall down from the second surface 20b of the wafer 20. "1" input as "BP" indicates the type of combination of various beam parameters. "Reference" input as "spherical aberration" indicates the correction amount of the spherical aberration of each ray of the processing lights L1, L2, and L3.

In the input reception part 103, the input of the "output" of each ray of the processing light L1, L2, and L3 may be restricted so that the processing light L1 branched on the foremost side in the relative movement direction A of the laser light L among the plurality of rays of processing light L1, L2, and L3 has the largest output. Furthermore, in the input reception part 103, each of the "spherical aberration" and "BP" may be input for each ray of the processing light L1, L2, and L3. In the input reception part 103, the formation depth of the modified region 12 by each ray of the processing light L1, L2, and L3 (that is, a value corresponding to the distance from the second surface 20b to each modified region 12) may be input instead of "ZH" or together with "ZH".

The storage part 102 (see FIG. 1) in the controller 10 stores pieces of data of a "reference SD", an "X-direction branch amount", and a "Y-direction shift amount" as data in a case where the laser processing method of the Y-direction shift in a state where the laser light L is branched into three rays of processing light L1, L2, and L3 is selected, as illustrated in (b) of FIG. 21.

The "reference SD" indicates a reference when the converging points C1, C2, and C3 fall down from the second surface 20b of the wafer 20. "SD2" input as the "reference SD" indicates that the converging point C2 of the processing light L2 is the reference (the converging point C1 of the processing light L1 or the converging point C3 of the processing light L3 may be used as the reference). The "X-direction branch amount" indicates a "distance between the converging point C1 of the processing light L1 and the converging point C3 of the processing light L3" (in this example, X10) in the X direction. In this case, as an example, a "distance between the converging point C1 of the processing light L1 and the converging point C2 of the processing light L2" in the X direction becomes X10/2, and a "distance between the converging point C2 of the processing light L2 and the converging point C3 of the processing light L3" in the X direction becomes X10/2. The "Y-direction shift amount" indicates the shift amount (in this example, Y1) in the Y direction, that is, a "distance between the converging point C0 of the non-modulated light and the converging point C2 of the processing light L2 being the 0th-order light" in the Y direction.

Figure 22:
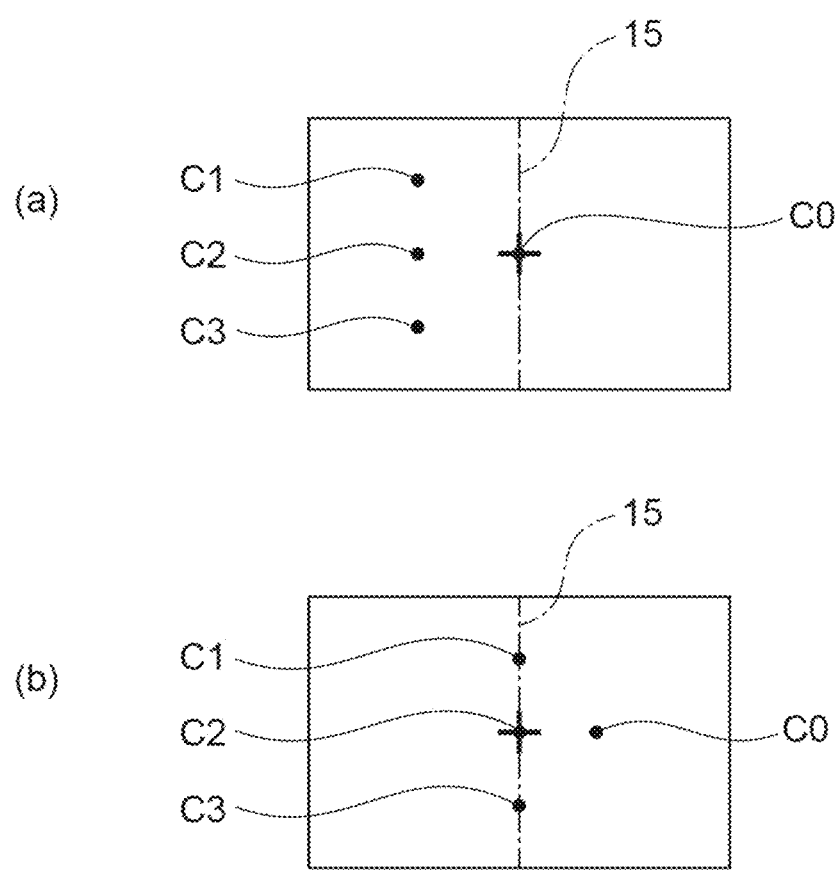
FIG. 22 is a view illustrating optical axis adjustment in the laser processing method of the Y-direction shift.

Then, the optical axis is adjusted in the laser processing apparatus 1 (S23 illustrated in FIG. 20). Specifically, the optical axis adjustment is as follows. In a case where the optical axis of the laser light L passing through the converging part 6 coincides with the optical axis of the converging part 6 (see FIG. 1), as illustrated in (a) of FIG. 22, when the line 15 is aligned with the center of an image (for example, an image of the second surface 20b of the wafer 20) acquired by the visible image capturing part 8, the converging point C0 of the non-modulated light is located on the line 15, and the plurality of converging points C1, C2, and C3 of the plurality of rays of processing light L1, L2, and L3 are located on one side with respect to the line 15. In the laser processing apparatus 1, the controller 10 controls the optical axis adjusting part 4 (see FIG. 1) so that, with respect to this state, the plurality of converging points C1, C2, and C3 are located on the line 15 as illustrated in (b) of FIG. 22.

As described above, in the laser processing apparatus 1, before the laser light L is emitted from the light source 3, the controller 10 controls the optical axis adjusting part 4 based on an image acquired by the visible image capturing part 8, so that the converging point C2 of the processing light L2 being the 0th-order light is located on the line 15. Such optical axis adjustment may be performed in advance in the laser processing apparatus 1.

Then, alignment is performed in the laser processing apparatus 1 (S24 illustrated in FIG. 20). Thus, the converging point C of the laser light L is located on the line 15 when viewed from the Z direction. Then, the height setting is performed in the laser processing apparatus 1 (S25 illustrated in FIG. 20). Thus, as illustrated on the left side of FIG. 23, the converging point C of the laser light L is located on the laser light entering surface (that is, the second surface 20b of the wafer 20).

Figure 23:
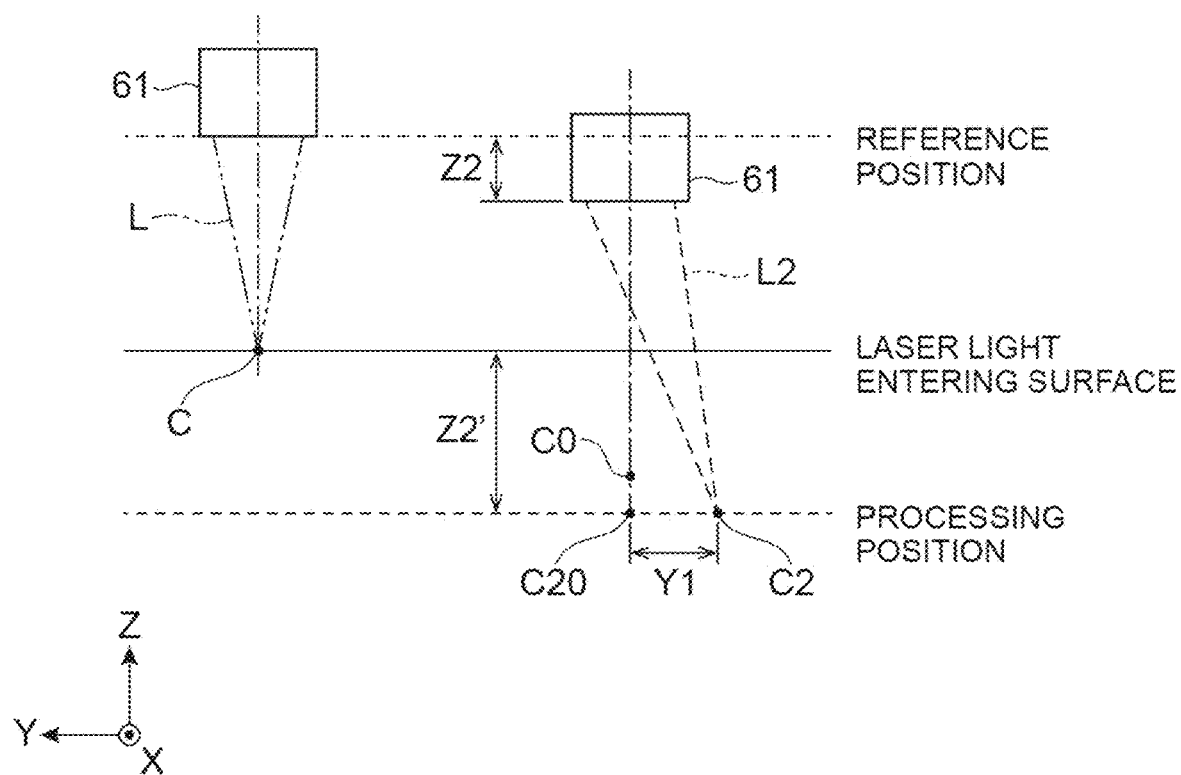
FIG. 23 is a diagram illustrating the laser processing method of the Y-direction shift.

As illustrated on the right side of FIG. 23, with the converging point C2 of the processing light L2 as a reference, the converging lens unit 61 (see FIG. 1) of the converging part 6 falls by Z2. Thus, the plurality of converging points C1, C2, and C3 of the plurality of rays of processing light L1, L2, and L3 are positioned with respect to the wafer 20 so that a "distance between the laser light entering surface and the converging point C2 of the processing light L2" in the Z direction becomes Z2' (a value corresponding to a value obtained by multiplying Z2 by the refractive index of the wafer 20), and a "distance between the converging point C0 of the non-modulated light and the converging point C2 of the processing light L2" in the Y direction becomes Y1.

As described above, in the laser processing apparatus 1, before the laser light L is emitted from the light source 3, the controller 10 controls the support part 2 and the housing H (that is, the converging part 6) based on an image acquired by the visible image capturing part 8, so that the converging point C2 of the processing light L2 being the 0th-order light is located at a predetermined depth from the second surface 20b of the wafer 20.

Then, the laser light L is emitted from the light source 3, and the laser light L is modulated by the spatial light modulator 5 (see FIG. 1). Then, the modulated laser light L (that is, a plurality of rays of processing light L1, L2, and L3) is converged on the wafer 20 (see FIG. 5) from the second surface 20b side (S26 illustrated in FIG. 20, second step). Specifically, the controller 10 controls the spatial light modulator 5 so that the laser light L is branched into the plurality of rays of processing light L1, L2, and L3 including the 0th-order light, and the plurality of converging points C1, C2, and C3 of the plurality of rays of processing light L1, L2, and L3 are located at positions different from each other in each of the Z direction and the X direction. Further, the controller 10 controls the spatial light modulator 5 so that the converging point C2 of the processing light L2 being the 0th-order light is located on one side with respect to the converging point C0 of the non-modulated light in the Y direction. The plurality of converging points C1, C2, and C3 are relatively moved along the line 15 in a state where the X direction coincides with the extension direction of the line 15.

Figure 24:
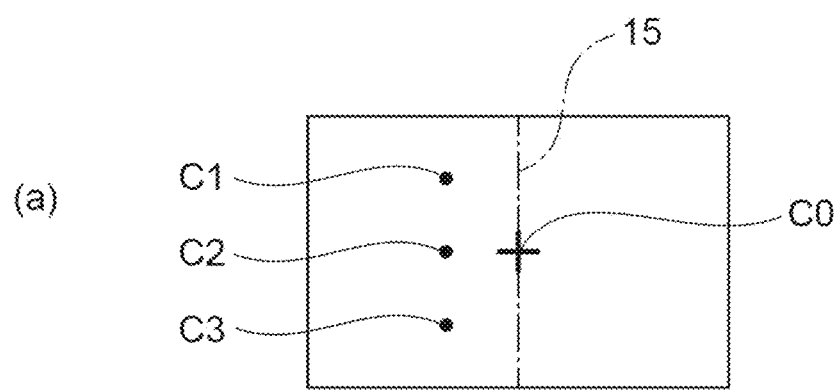
FIG. 24 is a view illustrating optical axis adjustment in the laser processing method of the Y-direction shift.
Figure 24:
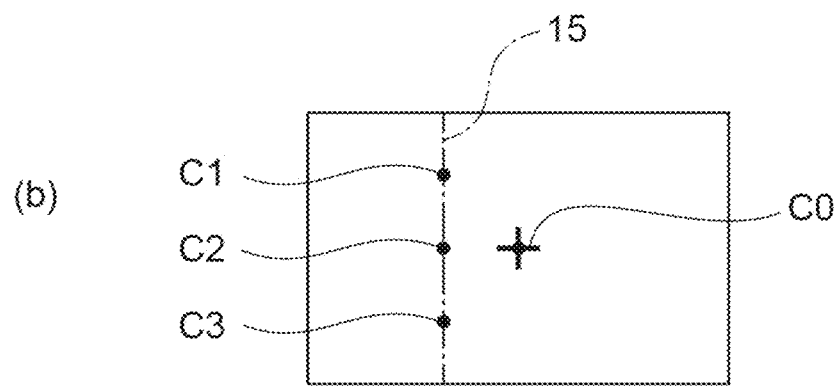

The optical axis adjustment may be performed as follows, for example, after alignment (S24 illustrated in FIG. 20) is performed. In a case where the optical axis of the laser light L passing through the converging part 6 coincides with the optical axis of the converging part 6 (see FIG. 1), as illustrated in (a) of FIG. 24, when the line 15 is aligned with the center of an image (for example, an image of the second surface 20b of the wafer 20) acquired by the visible image capturing part 8, the converging point C0 of the non-modulated light is located on the line 15, and the plurality of converging points C1, C2, and C3 of the plurality of rays of processing light L1, L2, and L3 are located on one side with respect to the line 15. In the laser processing apparatus 1, the controller 10 may control the support part 2 (see FIG. 1) so that, with respect to this state, the plurality of converging points C1, C2, and C3 are located on the line 15 as illustrated in (b) of FIG. 24. In this case, the optical axis adjusting part 4 is not used.

As described above, in the laser processing apparatus 1, before the laser light L is emitted from the light source 3, the controller 10 may control the support part 2 based on an image acquired by the visible image capturing part 8, so that the converging point C2 of the processing light L2 being the 0th-order light is located on the line 15.

As described above, in the laser processing apparatus 1, the converging point C2 of the processing light L2 being the 0th-order light is located on one side with respect to the converging point C0 of the non-modulated light in the Y direction. Thus, the occurrence of a situation in which the non-modulated light that is not modulated by the spatial light modulator 5 among rays of the laser light L has an influence on a converging state of the processing light L2 being the 0th-order light (for example, the non-modulated light interferes with the processing light L2 being the 0th-order light) is prevented. Thus, according to the laser processing apparatus 1 (and the laser processing method of Y-direction shift), it is possible to obtain high processing quality in processing of branching the laser light L into the plurality of rays of processing light L1, L2, and L3.

In addition, in the laser processing apparatus 1, before the laser light L is emitted from the light source 3, the controller 10 controls the optical axis adjusting part 4 based on an image of the wafer 20, which is acquired by the visible image capturing part 8, so that the converging point C2 of the processing light L2 being the 0th-order light is located on the line 15. Alternatively, in the laser processing apparatus 1, before the laser light L is emitted from the light source 3, the controller 10 controls the support part 2 based on an image of the wafer 20, which is acquired by the visible image capturing part 8, so that the converging point C2 of the processing light L2 being the 0th-order light is located on the line 15. In either case, before the laser light L is emitted from the light source 3, the controller 10 controls the support part 2 and the housing H (that is, the converging part 6) based on the image of the wafer 20, which is acquired by the visible image capturing part 8, so that the converging point C2 of the processing light L2 being the 0th-order light is located at a predetermined depth from the second surface 20b of the wafer 20. As a result, it is possible to easily and reliably locate the converging point C2 of the processing light L2 being the 0th-order light on the line 15.

In addition, in the laser processing apparatus 1, the controller 10 controls the spatial light modulator 5 so that the plurality of converging points C1, C2, and C3 of the plurality of rays of processing light L1, L2, and L3 are located on one side with respect to the converging point C0 of the non-modulated light in the Y direction. Thus, it is possible to arrange the plurality of converging points C1, C2, and C3 along the line 15.

In the laser processing apparatus 1, the controller 10 controls the spatial light modulator 5 so that the plurality of converging points C1, C2, and C3 of the plurality of rays of processing lights L1, L2, and L3 have a positional relation of being located closer to the first surface 20a of the wafer 20 in the Z direction toward the front side in the relative movement direction A of the laser light L. Thus, it is possible to suppress inhibition of converging of each of the plurality of rays of processing light L1, L2, and L3 by the formed modified region 12.

In addition, in the laser processing apparatus 1, the controller 10 controls the spatial light modulator 5 so that the processing light branched on the foremost side in the relative movement direction A of the laser light L among the plurality of rays of processing light L1, L2, and L3 has the largest output. Thus, in a case where a fracture extending through a plurality of rows of modified regions 12 is formed on the wafer 20, it is possible to largely extend the fracture to the first surface 20a side of the wafer 20.

[Operation of Laser Processing Apparatus and Laser Processing Method of Z-Direction Shift]

The laser processing method of the Z-direction shift, which is performed by the laser processing apparatus 1, will be described in more detail with reference to the flowchart illustrated in FIG. 25.

Figure 25:
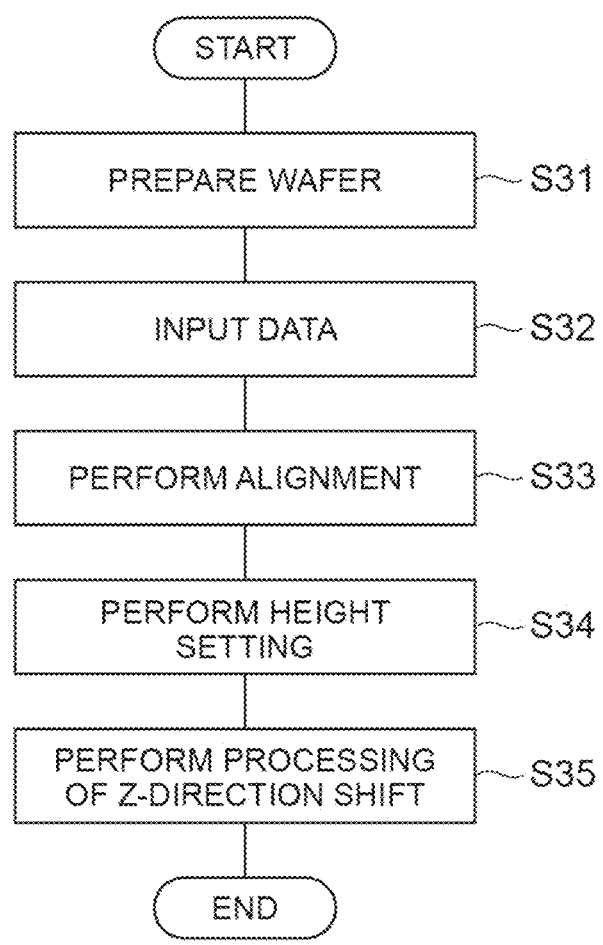
FIG. 25 is a flowchart illustrating the laser processing method of the Z-direction shift.

First, a wafer 20 is prepared (S31 illustrated in FIG. 25, first step). Specifically, as illustrated in FIG. 5, the wafer 20 is supported by the support part 2 so that the second surface 20b of the wafer 20 is perpendicular to the Z direction.

Then, data is input to the laser processing apparatus 1 (S32 illustrated in FIG. 25). Specifically, as illustrated in (a) of FIG. 26, various types of data input by the operator are received by the input reception part 103 (see FIG. 1) of the controller 10. In (a) of FIG. 26, "SD1" indicates processing light L1, "SD2" indicates processing light L2, and "SD3" indicates processing light L3. The operator can input the "number of branches" and a "shift direction", numerical values related to the rays of processing light L1, L2, and L3, and the like.

In this example, "3" is input as the "number of branches", and "Z direction" is input as the "shift direction". That is, the laser processing method of the Z-direction shift in a state where the laser light L is branched into three rays of processing lights L1, L2, and L3 is selected. Among the numerical values and the like related to the rays of processing light L1, L2, and L3, "ZH" indicates falling amounts (in this example, Z1, Z2, and Z3) when the converging points C1, C2, and C3 fall down from the second surface 20b of the wafer 20. "1" input as "BP" indicates the type of combination of various beam parameters. "Reference" input as "spherical aberration" indicates the correction amount of the spherical aberration of each ray of the processing lights L1, L2, and L3.

In the input reception part 103, the input of the "output" of each ray of the processing light L1, L2, and L3 may be restricted so that the processing light L1 branched on the foremost side in the relative movement direction A of the laser light L among the plurality of rays of processing light L1, L2, and L3 has the largest output. Furthermore, in the input reception part 103, each of the "spherical aberration" and "BP" may be input for each ray of the processing light L1, L2, and L3. In the input reception part 103, the formation depth of the modified region 12 by each ray of the processing light L1, L2, and L3 (that is, a value corresponding to the distance from the second surface 20b to each modified region 12) may be input instead of "ZH" or together with "ZH".

The storage part 102 (see FIG. 1) in the controller 10 stores pieces of data of a "reference SD", an "X-direction branch amount", and a "Z-direction shift amount" as data in a case where the laser processing method of the Z-direction shift in a state where the laser light L is branched into three rays of processing light L1, L2, and L3 is selected, as illustrated in (b) of FIG. 26.

The "reference SD" indicates a reference when the converging points C1, C2, and C3 fall down from the second surface 20b of the wafer 20. "SD2" input as the "reference SD" indicates that the converging point C2 of the processing light L2 is the reference (the converging point C1 of the processing light L1 or the converging point C3 of the processing light L3 may be used as the reference). The "X-direction branch amount" indicates a "distance between the converging point C1 of the processing light L1 and the converging point C3 of the processing light L3" (in this example, X10) in the X direction. In this case, as an example, a "distance between the converging point C1 of the processing light L1 and the converging point C2 of the processing light L2" in the X direction becomes X10/2, and a "distance between the converging point C2 of the processing light L2 and the converging point C3 of the processing light L3" in the X direction becomes X10/2. The "Z-direction shift amount" indicates the shift amount (in this example, Z4) in the Z direction, that is, a "distance between the ideal converging point IC of the 0th-order light and the converging point C2 of the processing light L2 being the 0th-order light" in the Z direction.

Then, alignment is performed in the laser processing apparatus 1 (S33 illustrated in FIG. 25). Thus, the converging point C of the laser light L is located on the line 15 when viewed from the Z direction. Then, the height setting is performed in the laser processing apparatus 1 (S34 illustrated in FIG. 25). Thus, as illustrated on the left side of FIG. 27, the converging point C of the laser light L is located on the laser light entering surface (that is, the second surface 20b of the wafer 20).

Figure 27:
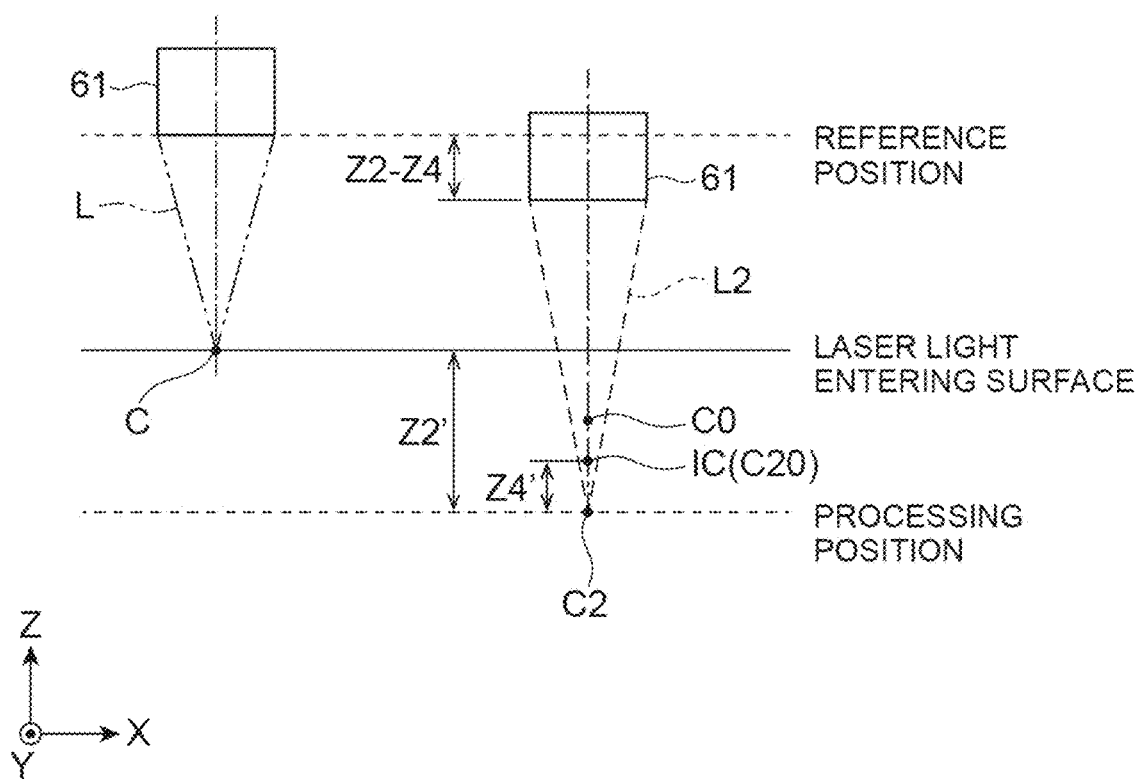
FIG. 27 is a diagram illustrating the laser processing method of the Z-direction shift.

As illustrated on the right side of FIG. 27, with the converging point C2 of the processing light L2 as a reference, the converging lens unit 61 (see FIG. 1) of the converging part 6 falls by "Z2-Z4". Thus, the plurality of converging points C1, C2, and C3 of the plurality of rays of processing lights L1, L2, and L3 are positioned with respect to the wafer 20 so that a "distance between the laser light entering surface and the converging point C2 of the processing light L2" in the Z direction becomes Z2' (a value corresponding to a value obtained by multiplying Z2 by the refractive index of the wafer 20), and a "distance between the ideal converging point IC of the 0th-order light and the converging point C2 of the processing light L2 being the 0th-order light" in the Z direction becomes Z4' (a value corresponding to a value obtained by multiplying Z4 by the refractive index of the wafer 20).

As described above, in the laser processing apparatus 1, before the laser light L is emitted from the light source 3, the controller 10 controls the support part 2 and the housing H (that is, the converging part 6) based on an image acquired by the visible image capturing part 8, so that the converging point C2 of the processing light L2 being the 0th-order light is located at a predetermined depth from the second surface 20b of the wafer 20.

Then, the laser light L is emitted from the light source 3, and the laser light L is modulated by the spatial light modulator 5 (see FIG. 1). Then, the modulated laser light L (that is, a plurality of rays of processing light L1, L2, and L3) is converged on the wafer 20 (see FIG. 5) from the second surface 20b side (S35 illustrated in FIG. 25, second step). Specifically, the controller 10 controls the spatial light modulator 5 so that the laser light L is branched into the plurality of rays of processing light L1, L2, and L3 including the 0th-order light, and the plurality of converging points C1, C2, and C3 of the plurality of rays of processing light L1, L2, and L3 are located at positions different from each other in each of the Z direction and the X direction. Further, the controller 10 controls the spatial light modulator 5 so that the converging point C2 of the processing light L2 being the 0th-order light is located on the opposite side of the converging point C0 of the non-modulated light with respect to the ideal converging point IC of the 0th-order light, in the Z direction. The plurality of converging points C1, C2, and C3 are relatively moved along the line 15 in a state where the X direction coincides with the extension direction of the line 15.

As described above, in the laser processing apparatus 1, the input reception part 103 receives the input of "ZH", and the storage part 102 stores the "Z-direction shift amount". Here, "ZH" corresponds to first data regarding the formation position of the modified region 12 by each ray of the processing light L1, L2, and L3. The "Z-direction shift amount" corresponds to second data regarding the "distance between the ideal converging point IC of the 0th-order light and the converging point C2 of the processing light L2 being the 0th-order light" in the Z direction. In the laser processing apparatus 1, the controller 10 controls the support part 2 and the housing H (that is, the converging part 6) based on "ZH" being the first data and "Z-direction shift amount" being the second data, so that the converging point C2 of the processing light L2 being the 0th-order light is located at a predetermined depth from the second surface 20b of the wafer 20. In the laser processing apparatus 1, the input reception part 103 may receive the input of the "Z-direction shift amount" being the second data. In the laser processing apparatus 1, the input reception part 103 may receive the input of the formation depth of the modified region 12 by each ray of the processing light L1, L2, and L3, as the first data instead of "ZH" or together with "ZH".

As described above, in the laser processing apparatus 1, the converging point C2 of the processing light L2 being the 0th-order light is located on the opposite side of the converging point C0 of the non-modulated light with respect to the ideal converging point IC of the 0th-order light, in the Z direction. Thus, the occurrence of a situation in which the non-modulated light that is not modulated by the spatial light modulator 5 among rays of the laser light L has an influence on a converging state of the processing light L2 being the 0th-order light (for example, the non-modulated light interferes with the processing light L2 being the 0th-order light) is prevented. Thus, according to the laser processing apparatus 1 (and the laser processing method of Z-direction shift), it is possible to obtain high processing quality in processing of branching the laser light L into the plurality of rays of processing light L1, L2, and L3. In the laser processing apparatus 1, the converging point C2 of the processing light L2 being the 0th-order light may be located on the opposite side of the ideal converging point IC of the 0th-order light with respect to the converging point C0 of the non-modulated light in the Z direction. Also in this case, the occurrence of a situation in which the non-modulated light that is not modulated by the spatial light modulator 5 among rays of the laser light L has an influence on a converging state of the processing light L2 being the 0th-order light.

In the laser processing apparatus 1, the input reception part 103 receives the input of "ZH" (first data on the formation position of the modified region 12 by each ray of the processing light L1, L2, and L3), and the controller 10 controls the support part 2 and the housing H (that is, the converging part 6) based on "ZH" and the "Z-direction shift amount" (second data regarding the distance between the ideal converging point IC of the 0th-order light and the converging point C2 of the processing light L2 being the 0th-order light in the Z direction), so that the converging point C2 of the processing light L2 being the 0th-order light is located at a predetermined depth from the second surface 20b of the wafer 20. Thus, it is possible to form a modified region 12 at a desired depth from the second surface 20b of the wafer 20 while suppressing an influence of non-modulated light on the converging state of the processing light L2 being the 0th-order light.

In the laser processing apparatus 1, the storage part 102 stores the "Z-direction shift amount". Thus, it is possible to save the trouble taken for the operator to input the "Z-direction shift amount". Alternatively, the input reception part 103 receives the input of the "Z-direction shift amount". Thus, the operator can set the "distance between the ideal converging point IC of the 0th-order light and the converging point C2 of the processing light L2 being the 0th-order light" in the Z direction, to a desired value.

In the laser processing apparatus 1, the controller 10 controls the spatial light modulator 5 so that the plurality of converging points C1, C2, and C3 of the plurality of rays of processing lights L1, L2, and L3 have a positional relation of being located closer to the first surface 20a of the wafer 20 in the Z direction toward the front side in the relative movement direction A of the laser light L. Thus, it is possible to suppress inhibition of converging of each of the plurality of rays of processing light L1, L2, and L3 by the formed modified region 12.

In addition, in the laser processing apparatus 1, the controller 10 controls the spatial light modulator 5 so that the processing light branched on the foremost side in the relative movement direction A of the laser light L among the plurality of rays of processing light L1, L2, and L3 has the largest output. Thus, in a case where a fracture extending through a plurality of rows of modified regions 12 is formed on the wafer 20, it is possible to largely extend the fracture to the first surface 20a side of the wafer 20.

Modification Examples

The present disclosure is not limited to the above embodiment. For example, in the above embodiment, the laser light L is branched into the three rays of processing light L1, L2, and L3 including the 0th-order light, but the present disclosure is not limited thereto. The laser light L may be branched into two rays of processing light including the 0th-order light or four or more rays of processing light including the 0th-order light. That is, the laser light L may be branched into a plurality of rays of processing light including the 0th-order light.

In addition, it is not essential in the present disclosure that the laser light L is modulated by the spatial light modulator 5 so that the plurality of converging points C1, C2, and C3 of the plurality of rays of processing lights L1, L2, and L3 have a positional relation of being located closer to the first surface 20a of the wafer 20 in the Z direction toward the front side in the relative movement direction A of the laser light L. In addition, it is not essential in the present disclosure that the laser light L is modulated by the spatial light modulator 5 so that the processing light L1 branched on the foremost side in the relative movement direction A of the laser light L among the plurality of rays of processing light L1, L2, and L3 has the largest output. Further, it is not essential in the present disclosure that, in the laser processing method of the X-direction shift, the controller 10 controls the spatial light modulator 5 so that the converging point C2 of the processing light L2 being the 0th-order light is located on the front side in the relative movement direction A of the laser light L with respect to the converging point C0 of the non-modulated light.

In addition, the controller 10 controls at least one (movement of at least one) of the support part 2 and the converging part 6 in order to adjust or change the positional relation between the wafer 20 supported by the support part 2 and the converging part 6 (that is, the positional relation between the wafer 20 supported by the support part 2 and each of the converging points C, C1, C2, C3, and the like).

The spatial light modulator in the present disclosure is not limited to the reflective liquid crystal spatial light modulator 5. As the spatial light modulator in the present disclosure, for example, a transmissive spatial light modulator may be used.

Each piece of data (that is, each piece of data stored in the storage part 102) illustrated in (b) of FIG. 18, (b) of FIG. 21, and (b) of FIG. 26 may be input from the input reception part 103 by the operator. In addition, the optical axis of the laser light L emitted from the light source 3 may be adjusted in a manner that the operator manually adjusts the optical axis adjusting part 4.

Various materials and shapes can be applied to each configuration in the above-described embodiment without being limited to the above-described materials and shapes. Further, the configurations in the embodiment or the modification examples described above can be randomly applied to the configuration in another embodiment or modification examples.

REFERENCE SIGNS LIST

1: Laser processing apparatus, 2: Support part, 3: Light source, 4: Optical axis adjusting part, 5: Spatial light modulator, 6: Converging part, 8: Visible image capturing part (image capturing part), 10: Controller, 12: Modified region, 15: Line, 20: Wafer (object), 20a: First surface, 20b: Second surface, 102: Storage part, 103: Input reception part, A: Relative movement direction, C, C0, C1, C2, C3: Converging point, IC: Ideal converging point, L: Laser light, L1, L2, L3: Processing light.

The invention claimed is:

1. A laser processing apparatus for forming a modified region in an object by irradiating the object with laser light, the apparatus comprising:
   a support part configured to support the object having a first surface and a second surface on an opposite side of the first surface so that the second surface is perpendicular to a Z direction;
   a light source configured to emit the laser light;
   a spatial light modulator configured to modulate the laser light emitted from the light source;
   a converging part configured to converge the laser light modulated by the spatial light modulator from the second surface side to the object; and
   a controller configured to control the spatial light modulator so that the laser light is branched into a plurality of rays of processing light including 0th-order light and a plurality of converging points for the plurality of rays of the processing light are located at positions different from each other in the Z direction and an X direction perpendicular to the Z direction, and control at least one of the support part and the converging part so that the X direction coincides with an extension direction of a line extending along the second surface and the plurality of converging points move relatively along the line, wherein
   the controller controls the spatial light modulator so that a converging point of the 0th-order light in the Z direction is located on an opposite side of a converging point of non-modulated light of the laser light with respect to an ideal converging point of the 0th-order light or on an opposite side of the ideal converging point of the 0th-order light with respect to the converging point of the non-modulated light.

2. The laser processing apparatus according to claim 1, wherein
   the controller includes an input reception part configured to receive an input of first data regarding a position of forming the modified region by the plurality of rays of processing light in the Z direction,
   the controller controls at least one of the support part and the converging part based on the first data and second data regarding a distance between the ideal converging point of the 0th-order light and the converging point of the 0th-order light, so that the converging point of the 0th-order light is located at a predetermined depth from the second surface.

3. The laser processing apparatus according to claim 2, wherein the controller further includes a storage part configured to store the second data.

4. The laser processing apparatus according to claim 2, wherein the input reception part receives an input of the second data.

5. The laser processing apparatus according to claim 1, wherein the controller controls the spatial light modulator so that the plurality of converging points have a positional relation of being located closer to the first surface in the Z direction toward a front side in a relative movement direction along the X direction of the laser light.

6. The laser processing apparatus according to claim 1, wherein the controller controls the spatial light modulator so that processing light branched on a foremost side in a relative movement direction of the laser light along the X direction among the plurality of rays of processing light has a largest output.

7. A laser processing method for forming a modified region in an object by irradiating the object with laser light, the method comprising:
   a first step of preparing the object having a first surface and a second surface on an opposite side of the first surface; and
   a second step of modulating the laser light by using a spatial light modulator, in a state where the object is supported so that the second surface is perpendicular to a Z direction, and converging the modulated laser light to the object from the second surface side, wherein
   in the second step, the spatial light modulator is controlled so that the laser light is branched into a plurality of rays of processing light including 0th-order light and a plurality of converging points for the plurality of rays of the processing light are located at positions different from each other in the Z direction and an X direction perpendicular to the Z direction, the spatial light modulator is controlled so that a converging point of the 0th-order light in the Z direction is located on an opposite side of a converging point of non-modulated light of the laser light with respect to an ideal converging point of the 0th-order light or on an opposite side of the ideal converging point of the 0th-order light with respect to the converging point of the non-modulated light, and the plurality of converging points are moved relatively along a line in a state where the X direction coincides with an extension direction of the line extending along the second surface.

* * * * *